(12) United States Patent
Kim et al.

(10) Patent No.: US 11,095,037 B2
(45) Date of Patent: Aug. 17, 2021

(54) ANTENNA MODULE

(71) Applicant: Samsung Electro-Mechanics Co., Ltd., Suwon-si (KR)

(72) Inventors: Doo Il Kim, Suwon-si (KR); Yong Ho Baek, Suwon-si (KR); Jin Seon Park, Suwon-si (KR); Young Sik Hur, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 15 days.

(21) Appl. No.: 16/005,951

(22) Filed: Jun. 12, 2018

(65) Prior Publication Data

US 2019/0051989 A1 Feb. 14, 2019

(30) Foreign Application Priority Data

Aug. 11, 2017 (KR) .................. 10-2017-0102556
Nov. 9, 2017 (KR) .................. 10-2017-0148912

(51) Int. Cl.
*H01Q 15/08* (2006.01)
*H01L 23/66* (2006.01)
(Continued)

(52) U.S. Cl.
CPC ............ *H01Q 15/08* (2013.01); *H01L 23/66* (2013.01); *H01Q 1/2283* (2013.01);
(Continued)

(58) Field of Classification Search
CPC ............... H01Q 1/2283; H01Q 15/08; H01L 2223/6677; H01L 23/66
See application file for complete search history.

(56) References Cited

U.S. PATENT DOCUMENTS 6,114,997 A * 9/2000 Lee .................. H01Q 1/38
343/700 MS
7,236,070 B2 * 6/2007 Ajioka .................. H01L 23/552
257/E23.114
(Continued)

FOREIGN PATENT DOCUMENTS

CN 1595649 A 3/2005
CN 1682402 A 10/2005
(Continued)

OTHER PUBLICATIONS

Korean Office Action dated Nov. 14, 2018, in corresponding Korean Application No. 10-2017-0148912 (6 pages in English, 6 pages in Korean).
(Continued)

*Primary Examiner* — Graham P Smith
*Assistant Examiner* — Amal Patel
(74) *Attorney, Agent, or Firm* — NSIP Law

(57) ABSTRACT

An antenna module includes: a connection member including at least one wiring layer and at least one insulating layer; an integrated circuit (IC) disposed on a first surface of the connection member and electrically connected to the at least one wiring layer; an antenna package including antenna members configured to transmit or receive a radio frequency (RF) signal, a feed vias each having one end electrically connected to a respective one of the antenna members and another end electrically connected to the at least one wiring layer, and a dielectric layer having a height greater than a height of the at least one insulating layer, and having a first surface facing a second surface of the connection member; and dielectric members disposed in positions corresponding to the antenna members on the second surface of the antenna package.

10 Claims, 24 Drawing Sheets

(51) Int. Cl.
*H01Q 19/06* (2006.01)
*H01Q 19/22* (2006.01)
*H01Q 1/22* (2006.01)
*H01Q 1/24* (2006.01)
*H01Q 1/40* (2006.01)
*H01Q 21/06* (2006.01)

(52) U.S. Cl.
CPC ......... *H01Q 19/062* (2013.01); *H01Q 19/22* (2013.01); *H01L 2223/6677* (2013.01); *H01Q 1/243* (2013.01); *H01Q 1/40* (2013.01); *H01Q 21/065* (2013.01)

(56) References Cited

U.S. PATENT DOCUMENTS

| | | | |
|---|---|---|---|
| 9,608,334 B2* | 3/2017 | Spella | H01Q 19/062 |
| 2005/0069277 A1 | 3/2005 | Nakazawa et al. | |
| 2005/0088260 A1 | 4/2005 | Ajioka et al. | |
| 2008/0105966 A1* | 5/2008 | Beer | H01L 23/552 |
| | | | 257/690 |
| 2010/0177012 A1 | 7/2010 | Morrow | |
| 2011/0109521 A1 | 5/2011 | Pilard et al. | |
| 2012/0280380 A1* | 11/2012 | Kamgaing | H01Q 1/2283 |
| | | | 257/679 |
| 2014/0063754 A1 | 3/2014 | Jünemann et al. | |
| 2015/0029062 A1 | 1/2015 | Ng et al. | |
| 2015/0249283 A1 | 9/2015 | Watanabe et al. | |
| 2019/0036232 A1 | 1/2019 | Kang et al. | |

FOREIGN PATENT DOCUMENTS

| | | |
|---|---|---|
| CN | 103199337 A | 7/2013 |
| CN | 103392261 A | 11/2013 |
| CN | 104793188 A | 7/2015 |
| CN | 105789843 A | 7/2016 |
| CN | 109309280 A | 2/2019 |
| EP | 2 323 077 A1 | 5/2011 |
| JP | 2005-536929 A | 12/2005 |
| JP | 2015-8410 A | 1/2015 |
| KR | 10-2014-0005339 A | 1/2014 |
| KR | 10-1524559 B1 | 6/2015 |
| WO | WO 2004/019443 A1 | 3/2004 |
| WO | WO 2012/151123 A2 | 11/2012 |

OTHER PUBLICATIONS

Chinese Office Action dated Feb. 3, 2020 in the related Chinese Patent Application No. 201810884980.4 (14 pages in English, 11 pages in Korean).

Chinese Office Action dated Feb. 3, 2021 issued in counterpart Chinese Patent Application No. 201810884980.4 (12 pages in English)(6 pages in Chinese).

* cited by examiner

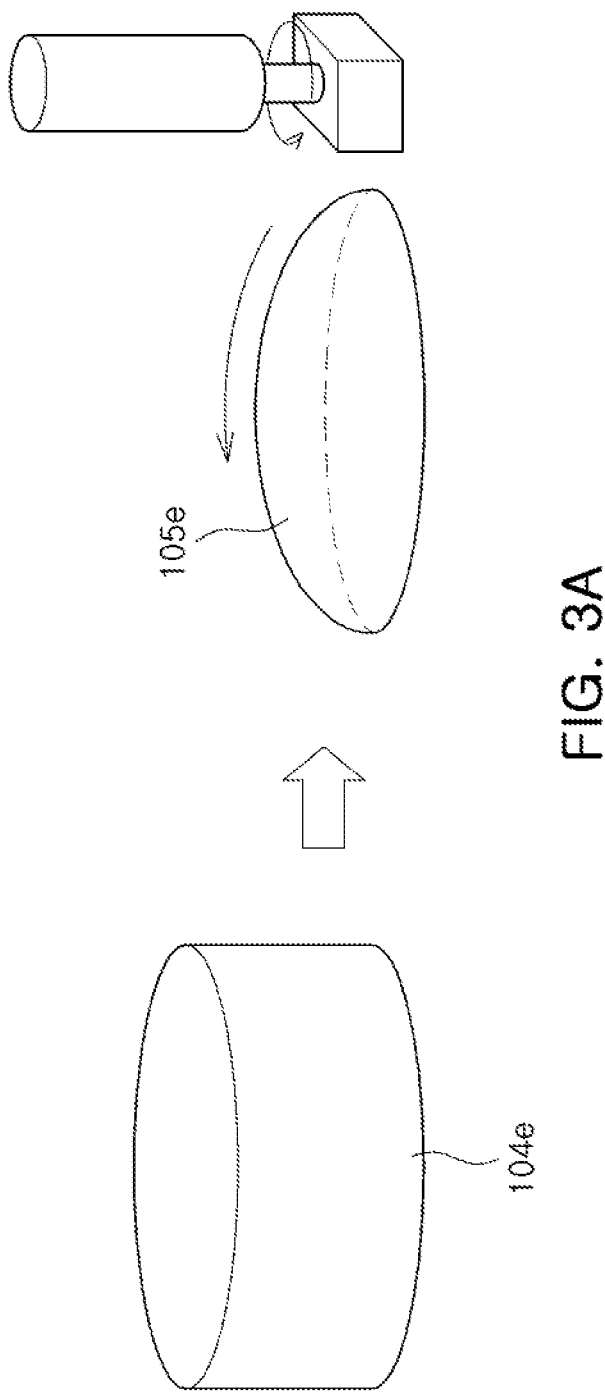

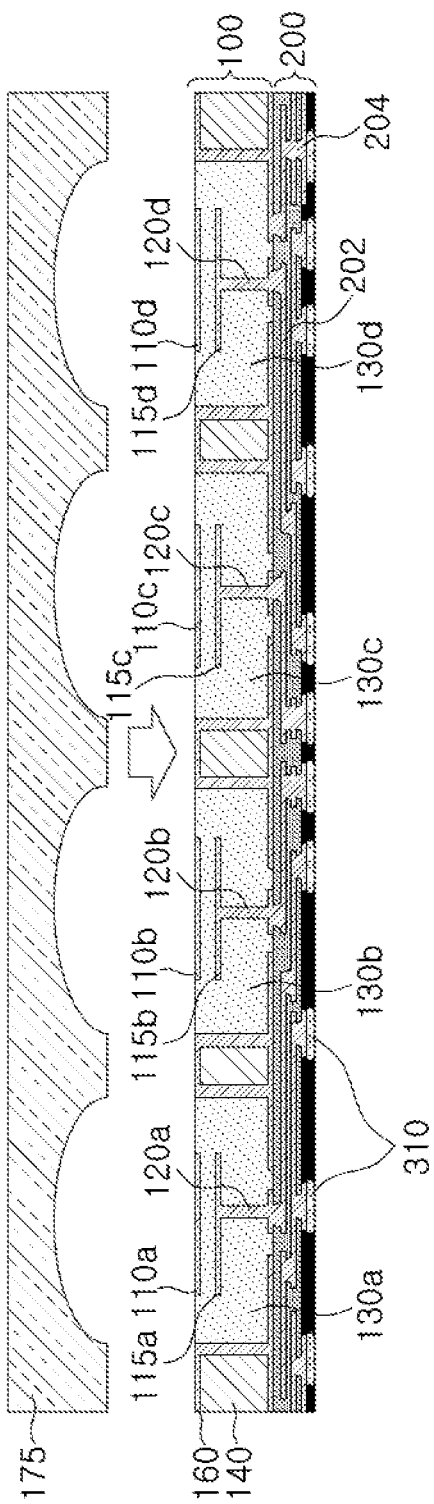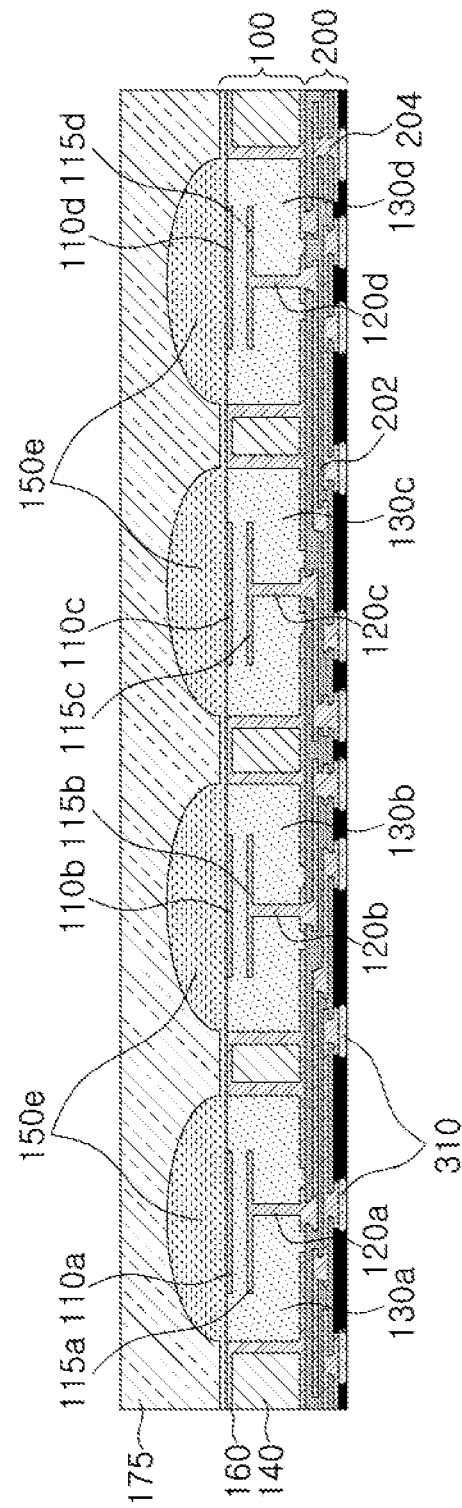

Theta / Degree vs. dB

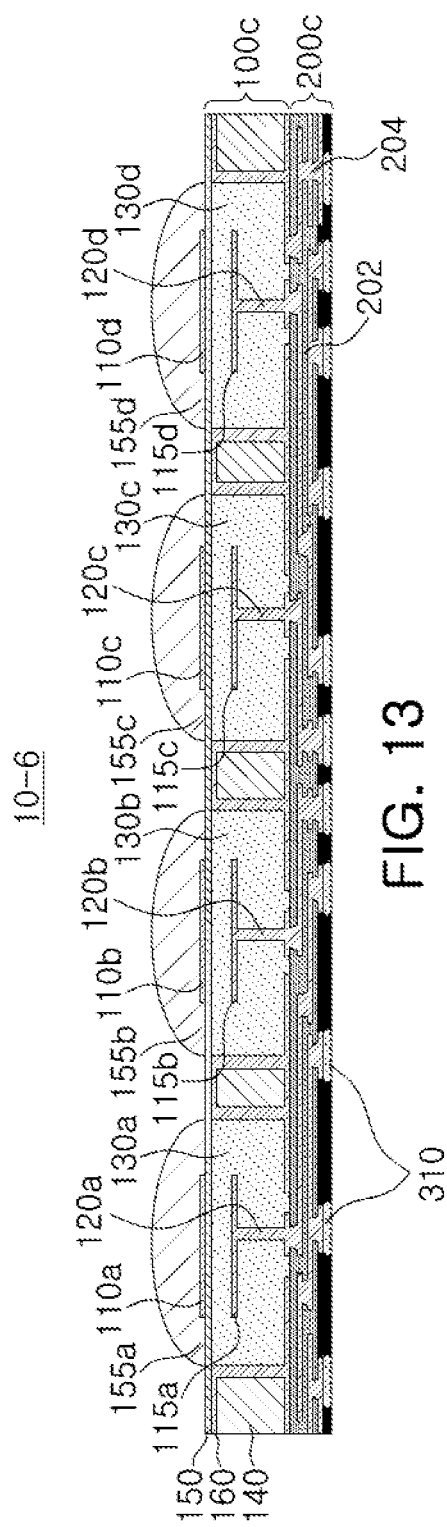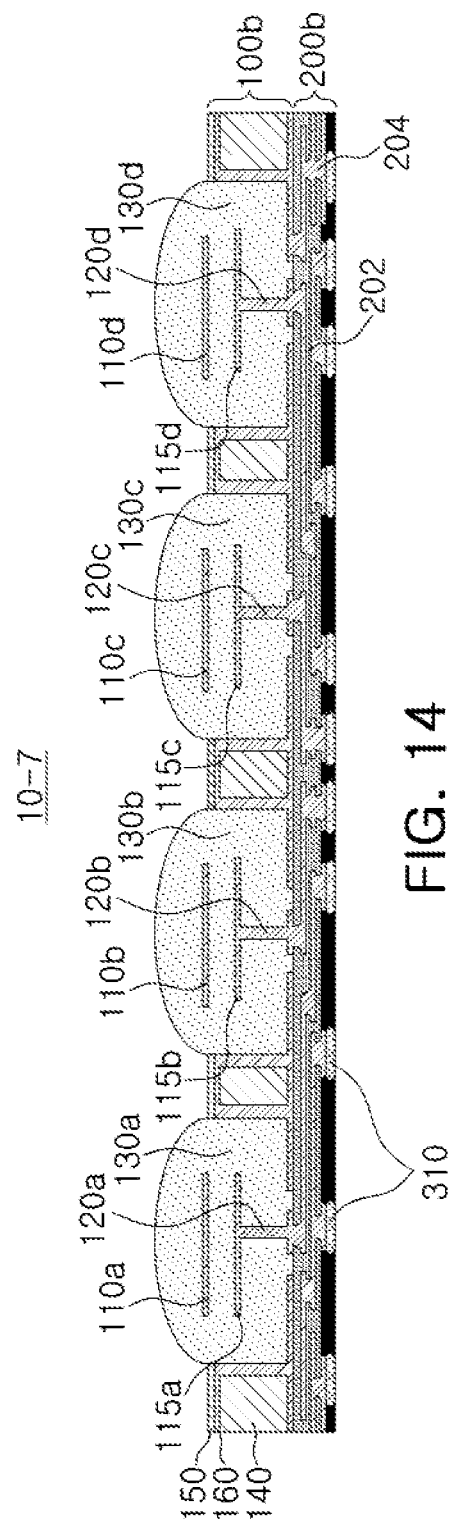

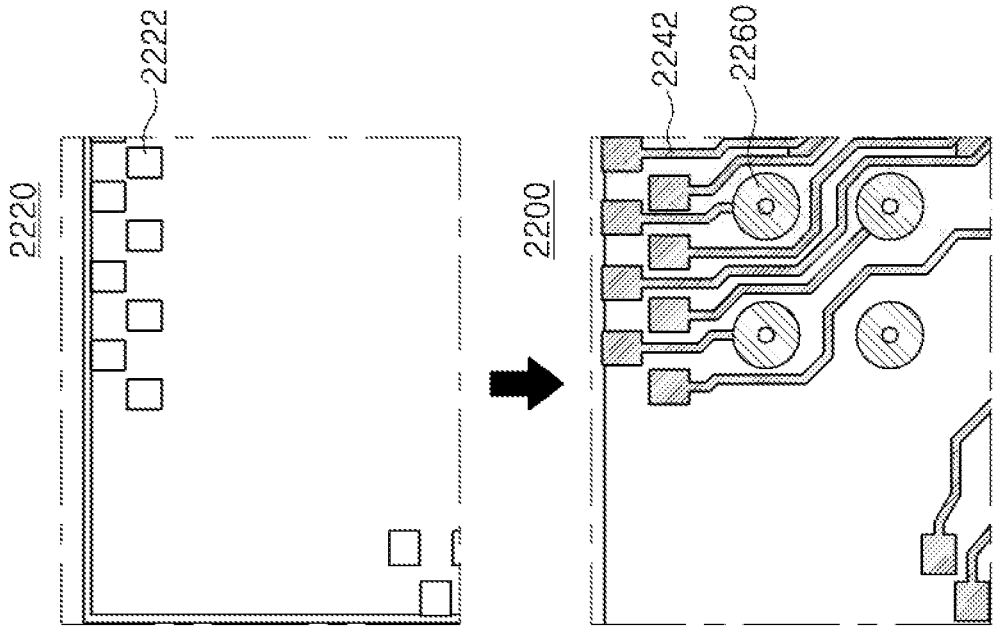
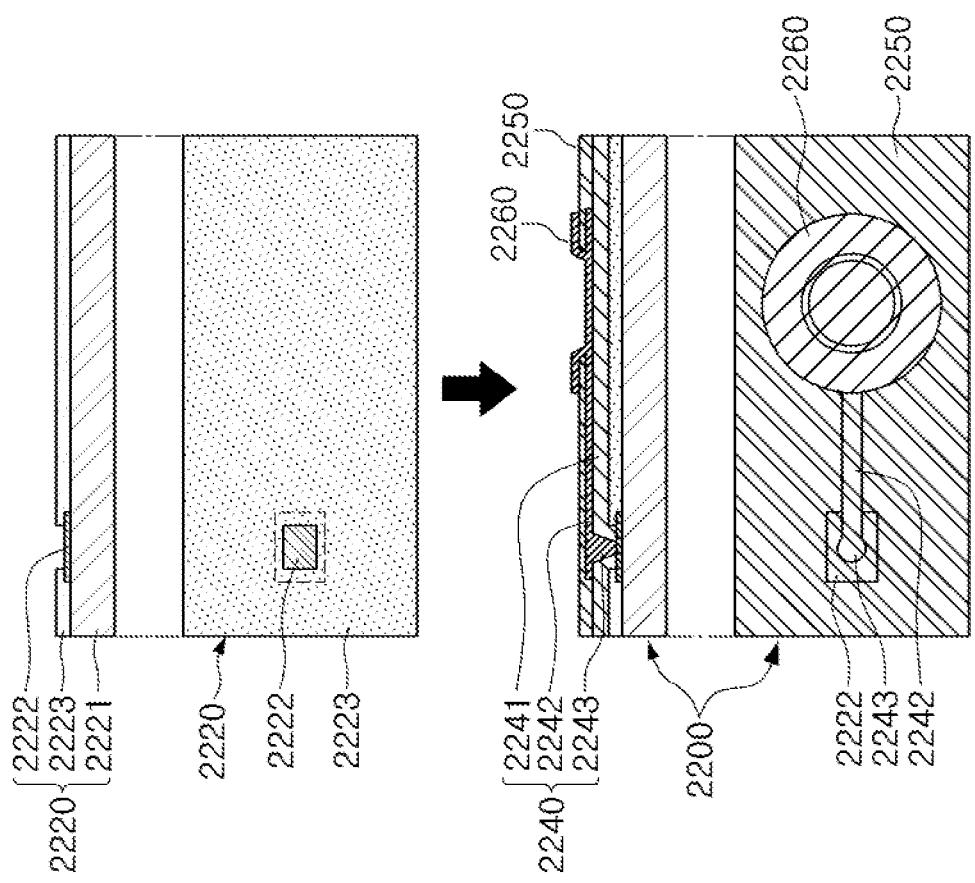
FIG. 20A
FIG. 20B

ANTENNA MODULE

CROSS-REFERENCE TO RELATED APPLICATIONS

This application claims the benefit under 35 U.S.C. § 119(a) of Korean Patent Application Nos. 10-2017-0102556 and 10-2017-0148912 filed on filed on Aug. 11, 2017 and Nov. 9, 2017, respectively, in the Korean Intellectual Property Office, the entire disclosures of which are incorporated herein by reference for all purposes.

BACKGROUND

1. Field

The following description relates to an antenna module.

2. Description of Related Art

Recently, millimeter wave (mmWave) communications including 5th (5G) communications have been researched, and research into commercialization of an antenna module that smoothly implements the millimeter wave communications has been performed.

Conventionally, an antenna module providing a millimeter wave communications environment uses a structure in which an integrated circuit (IC) and an antenna are disposed on a board and are connected to each other by a coaxial cable in order to provide a high level of antennal performance (e.g., a transmission and reception rate, a gain, and directivity, for example) at a high frequency.

However, such a structure may cause a shortage of an antenna layout space, a restriction of the degree of freedom of an antenna shape, an increase in interference between the antenna and the IC, and an increase in the size/cost of the antenna module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna module includes: a connection member including at least one wiring layer and at least one insulating layer; an integrated circuit (IC) disposed on a first surface of the connection member and electrically connected to the at least one wiring layer; an antenna package including antenna members configured to transmit or receive a radio frequency (RF) signal, a feed vias each having one end electrically connected to a respective one of the antenna members and another end electrically connected to the at least one wiring layer, and a dielectric layer having a height greater than a height of the at least one insulating layer, and having a first surface facing a second surface of the connection member; and dielectric members disposed in positions corresponding to the antenna members on the second surface of the antenna package.

Each of the dielectric members may have a form of hemisphere or a semi-convex lens.

The antenna module may further include an encapsulation member disposed between the second surface of the antenna package and the dielectric members.

A dielectric constant of each of the dielectric members may be the same as a dielectric constant of the encapsulation member.

A dielectric constant of each of the dielectric members may be different from a dielectric constant of the at least one insulating layer, and a dielectric constant of the dielectric layer may be different from the dielectric constant of the at least one insulating layer.

Each of the dielectric members may include a director member configured to transmit or receive the RF signal together with a corresponding antenna member among antenna members.

The antenna package may further include a plating member disposed around a side surface of each of the feed vias and covering at least a portion of the first surface of the antenna package.

The antenna package may further include a directional antenna member electrically connected to the at least one wiring layer and configured to transmit or receive a second RF signal to a third surface of the antenna package. The antenna module may further include a directional dielectric member disposed on the third surface of the antenna package.

The antenna module may further include: a core member disposed on the first surface or the second surface of the connection member and forming an accommodation space; and a passive component disposed in the accommodation space and electrically connected to the at least one wiring layer.

The antenna module may further include a core via disposed on the first surface of the connection member and electrically connected to the at least one wiring layer, wherein the IC is configured to receive a base signal from the core via and generate the RF signal in a millimeter wave (mmWave) band based on the base signal.

The antenna module may further include a fan-out semiconductor package including an encapsulant encapsulating at least a portion of the IC, and a core member, wherein the core member includes a core via electrically connected to the at least one wiring layer, a core insulating layer surrounding a side surface of the core via, and a core wiring layer disposed on a first surface or a second surface of the core insulating layer and electrically connected to the core via.

In another general aspect, an antenna module includes: a connection member including at least one wiring layer and at least one insulating layer; an integrated circuit (IC) disposed on a first surface of the connection member and electrically connected to the at least one wiring layer; antenna members disposed in cavities and configured to transmit or receive a radio frequency (RF) signal; feed vias disposed in the cavities, each of the feed vias having one end electrically connected to a corresponding one of the antenna members and another end electrically connected to the at least one wiring layer; plating members disposed in the cavities, around side surfaces of the feed vias, each of the plating members having a first surface facing a second surface of the connection member; an insulating member having a first surface facing the second surface of the connection member, disposed around side surfaces of the cavities, and having a height greater than a height of the at least one insulating layer; and a dielectric member disposed on a second surface of the insulating member and on the cavities, and configured so that a height of each of regions corresponding to the cavities is greater than a height of a region corresponding to the insulating member, or a height of the dielectric member in each of the regions corresponding to the cavities is less than a height of the dielectric member in the region corresponding to the insulating member.

A surface of the dielectric member may protrude in a form of hemisphere or a semi-convex lens on each of the regions corresponding to the cavities.

The dielectric member may have a concave surface in a form of a hemisphere or a semi-convex lens on each of the regions corresponding to the cavities.

The antenna module may further include a dielectric layer disposed in the cavities, around the feed vias, and between the feed vias and the plating members, wherein a dielectric constant of the dielectric layer is different from a dielectric constant of the at least one insulating layer, and wherein a height of the dielectric layer is greater than a height of the insulating member.

The dielectric member may include director members disposed in each of the regions corresponding to the cavities and configured to transmit or receive the RF signal together with a corresponding antenna member among the antenna members.

Other features and aspects will be apparent from the following detailed description, the drawings, and the claims.

BRIEF DESCRIPTION OF DRAWINGS

FIG. 3A is a view illustrating machining of a dielectric member using a mechanical machining method, according to an embodiment.

FIGS. 5A through 5C are views illustrating processes of manufacturing the antenna module of FIG. 4, according to an embodiment.

FIG. 13 is a view illustrating a structure in which dielectric layers and a dielectric members of an antenna module, according to an embodiment, are integrated.

FIG. 14 is a view illustrating a structure in which director members of an antenna module, according to an embodiment, are disposed on dielectric members.

FIGS. 20A and 20B are a schematic cross-sectional views illustrating states of a fan-in semiconductor package before and after being packaged, according to an embodiment.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
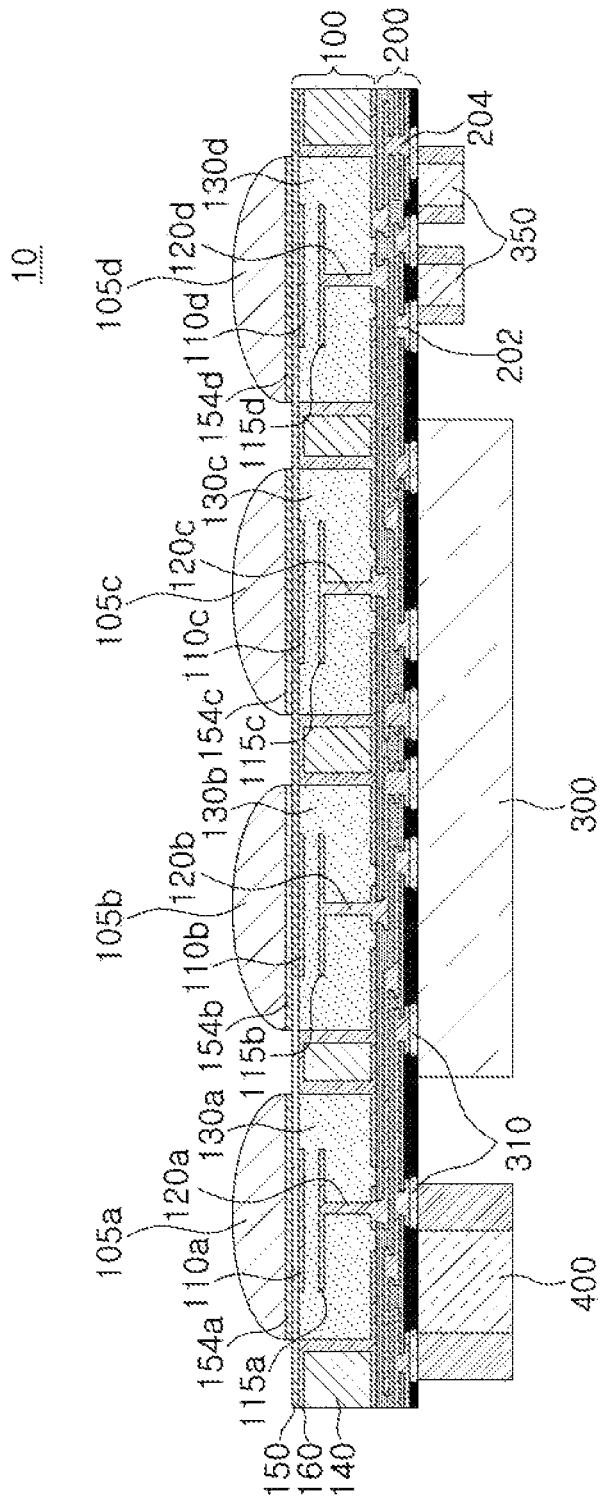
FIG. 1 is a view illustrating an antenna module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an antenna module 10, according to an exemplary embodiment in the present disclosure.

Referring to FIG. 1, the antenna module 10 may have a heterogeneous structure in which an antenna package 100 and a connection member 200 are coupled to each other. That is, the antenna module 10 may be miniaturized while improving antenna performance (e.g., a transmission and reception rate, a gain, directivity, and other parameters) by utilizing both characteristics that facilitate improving the antenna performance of the antenna package and characteristics that facilitate implementing a circuit pattern or an integrated circuit (IC) of a fan-out package.

Referring to FIG. 1, the antenna package 100 may include at least a portion of dielectric members 105a, 105b, 105c, and 105d, director members 110a, 110b, 110c, and 110d, antenna members 115a, 115b, 115c, and 115d, feed vias 120a, 120b, 120c, and 120d, dielectric layers 130a, 130b, 130c, and 130d, an insulating member 140, an encapsulation member 150, adhesive members 154a, 154b, 154c, and 154d, and a plating member 160, and the connection member 200 may include at least one wiring layer 202 and at least one insulating layer 204.

Each of the director members 110a, 110b, 110c, and 110d may be disposed adjacent to one surface of the antenna module (an upper surface in FIG. 1), and may receive an RF signal or transmit an RF signal generated by an IC 300 together with a corresponding antenna member 115a, 115b, 115c, or 115d.

Each of the antenna members 115a, 115b, 115c, and 115d may be electromagnetically coupled to a corresponding director member 110a, 110b, 110c, or 110d, and may receive the RF signal or transmit the RF signal generated by an IC 300 together with the corresponding director member 110a, 110b, 110c, or 110d.

For example, each of the antenna members 115a, 115b, 115c, and 115d may have a form (e.g., a patch antenna) similar to a form of the corresponding director member 110a, 110b, 110c, or 110d, and may be adjacent to the corresponding director member 110a, 110b, 110c, or 110d to improve antenna performance (e.g., transmission and reception rate, a gain, directivity, and other parameters) of the corresponding director member 110a, 110b, 110c, or 110d.

Depending on a design, the director members 110a, 110b, 110c, and 110d may be omitted, or at least one other director member may be disposed on the director members 110a, 110b, 110c, and 110d.

Each of the feed vias 120a, 120b, 120c, and 120d may be electrically connected to a corresponding antenna member 115a, 115b, 115c, or 115d to provide a path of the RF signal. Each of the feed vias 120a, 120b, 120c, and 120d may extend by a length greater than a thickness of the insulating layer of the connection member 200. Accordingly, transmission efficiency of the RF signal may be improved.

Each of the dielectric layers 130a, 130b, 130c, and 130d may have a form in which a corresponding feed via 120a, 120b, 120c, or 120d penetrates therethrough, and may surround the corresponding feed via 120*a*, 120*b*, 120*c*, or 120*d*. Each of the dielectric layers 130*a*, 130*b*, 130*c*, and 130*d* may have a height greater than a height of at least one insulating layer of the connection member 200.

Due to the length of each of the feed vias 120*a*, 120*b*, 120*c*, and 120*d*, and the thickness of each of the dielectric layers 130*a*, 130*b*, 130*c*, and 130*d*, a boundary condition for transmission and reception operation of the corresponding antenna member 115*a*, 115*b*, 115*c*, or 115*d* may be freely designed. Accordingly, since each of the feed vias 120*a*, 120*b*, 120*c*, and 120*d* and each of the dielectric layers 130*a*, 130*b*, 130*c*, and 130*d* may provide the boundary condition (e.g., small manufacturing tolerance, a short electrical length, a smooth surface, a large size of the dielectric layer, a dielectric constant adjustment, and other conditions) advantageous to the transmission and reception operation of the RF signal of the corresponding antenna member 115*a*, 115*b*, 115*c*, or 115*d*, antenna performance of the corresponding antenna member 115*a*, 115*b*, 115*c*, or 115*d* may be improved.

For example, the dielectric layer 130*a*, 130*b*, 130*c*, and 130*d* is formed of an insulating layer or a material (e.g., glass, ceramic, silicon, quartz, or teflon) having a dielectric constant Dk higher than the dielectric constant of the insulating member 140. Accordingly, the antenna performance of the corresponding antenna member 115*a*, 115*b*, 115*c*, or 115*d* may be further improved.

The insulating member 140 may have a thickness similar to the thickness of each of the dielectric layers 130*a*, 130*b*, 130*c*, and 130*d*, and may be formed of the same material as the material of at least one insulating layer 204 of the connection member 200. For example, the insulating member 140 may be formed of a general copper clad laminate (CCL) or prepreg.

The plating member 160 may be plated on the insulating member 140, and may be disposed between the dielectric layers 130*a*, 130*b*, 130*c*, and 130*d* and the insulating member 140 and on an upper surface of the insulating member 140.

Since the plating member 160 may provide the boundary condition advantageous to the transmission and reception operation of the RF signal of the corresponding antenna member 115*a*, 115*b*, 115*c*, or 115*d*, the plating member 160 may improve antenna performance of the corresponding antenna member 115*a*, 115*b*, 115*c*, or 115*d*.

The encapsulation member 150 may be disposed on the director members 110*a*, 110*b*, 110*c*, and 110*d* and the plating member 160, and may be partially inserted into a gap between each of the dielectric layer 130*a*, 130*b*, 130*c*, and 130*d* and the insulating member 140 during a manufacturing process. The encapsulation member 150 may be formed of a photo imageable encapsulant (PIE), Ajinomoto build-up film (ABF), epoxy molding compound (EMC), or the like, but is not limited thereto. The encapsulation member 150 may prevent oxidation of the director members 110*a*, 110*b*, 110*c*, and 110*d* or the antenna members 115*a*, 115*b*, 115*c*, and 115*d* and the plating member 160 to improve stability of the antenna package 100.

For example, the connection member 200 may have a structure similar to a copper redistribution layer (RDL) of a printed circuit board (PCB).

The wiring layer 202 may be electrically connected to the feed vias 120*a*, 120*b*, 120*c*, and 120*d* to provide the path of the RF signal, may provide a ground region and/or power source region supporting the IC 300, and may provide an electrical path between core members 400*a* and 400*b* and the IC 300. A detailed form of the wiring layer 202 is not limited to the form illustrated in FIG. 1. For example, the wiring layer 202 may include a plurality of wiring vias electrically connecting feed vias, which are electrically separated from each other and correspond to each other, and the IC 300 to each other.

Referring to FIG. 1, at least a portion of the IC 300, electrical connection structures 310, passive components 350, and a core member 400 may be disposed on the other surface of the antenna module (a lower surface in FIG. 1).

The IC 300 may generate the RF signal and may receive the RF signal received through each of the antenna members 115*a*, 115*b*, 115*c*, and 115*d*. For example, the IC 300 may receive a base signal through the core member 400 and perform at least a portion of a frequency conversion, amplification, filtering, a phase control, and a power generation of the base signal to generate an RF signal of a millimeter wave (mmWave) band (e.g., 28 GHz, 60 GHz).

The electrical connection structures 310 may electrically connect between the IC 300 and the wiring layer 202 and may electrically connect the core member 400 and the wiring layer 202 to each other. In addition, the electrical connection structures 310 may be encapsulated by an encapsulant for improving layout stability for the other surface of the antenna module (the lower surface in FIG. 1) of the IC 300. For example, the electrical connection structures 310 may be implemented as electrodes, pins, solder balls, lands, and the like.

The passive components 350 may provide at least a portion of a resistance value, a capacitance, and an inductance to the IC 300. For example, the passive components 350 may include a multilayer ceramic capacitor (MLCC).

The core member 400 may receive the base signal and/or power, may transmit a low frequency signal and/or power to the IC 300, and may be electrically connected to the wiring layer 202 by the electrical connection structure 310.

For example, the core member 400 may include a core wiring layer, a core insulating layer, and a connection pad. Depending on a design, the core member 400 may be replaced with a connector or a receptacle receiving the base signal.

The antenna members 115*a*, 115*b*, 115*c*, and 115*d*, the feed vias 120*a*, 120*b*, 120*c*, and 120*d*, the plating member 160, and the electrical connection structures 310 may be formed by a plating method such as chemical vapor deposition (CVD), physical vapor deposition (PVD), sputtering, subtractive, additive, semi-additive process (SAP), modified semi-additive process (MSAP), or the like, but is not limited to such methods.

Figure 2:
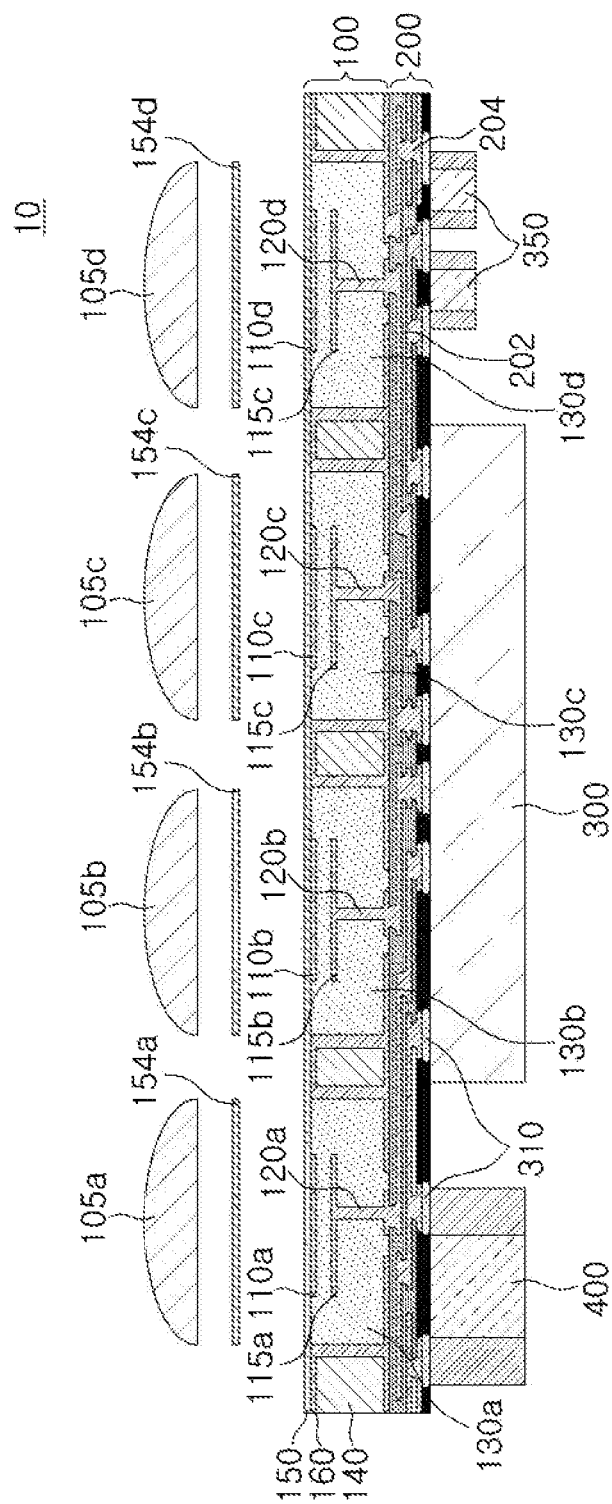
FIG. 2 is a view illustrating a layout of dielectric members using an adhesive member in the antenna module of FIG. 1.

FIG. 2 is a view illustrating a layout of dielectric members 105*a*, 105*b*, 105*c*, and 105*d* using the adhesive members 154*a*, 154*b*, 154*c*, and 154*d* in the antenna module 10.

Referring to FIG. 2, each of dielectric members 105*a*, 105*b*, 105*c*, and 105*d* may be disposed on the corresponding director member 110*a*, 110*b*, 110*c*, or 110*d* and/or antenna member 115*a*, 115*b*, 115*c*, or 115*d* through each of the adhesive members 154*a*, 154*b*, 154*c*, and 154*d*.

Each of the dielectric members 105*a*, 105*b*, 105*c*, and 105*d* may have a hemisphere shape, a semi-elliptical shape, or a lens shape. A detailed shape of each of the dielectric members 105*a*, 105*b*, 105*c*, and 105*d* may be varied according to optimization of refraction/diffraction/reflection characteristics of the RF signal, a height standard, structural adhesion stability, and other characteristics.

Each of the dielectric members 105*a*, 105*b*, 105*c*, and 105*d* may increase a transmission and reception area of the corresponding antenna member 115*a*, 115*b*, 115*c*, or 115*d*, and may induce refraction/diffraction/reflection of the RF signal to further improve a transmission and reception rate or a gain of the antenna member 115a, 115b, 115c, or 115d. For example, the RF signal which is refracted/diffracted/reflected and is introduced into each of the dielectric layers 130a, 130b, 130c, and 130d may be reflected at least one time by the plating member 160 to meet the antenna member 115a, 115b, 115c, or 115d.

In comparison with a structure in which a single dielectric member is disposed on a plurality of antenna members, each of the dielectric members 105a, 105b, 105c, and 105d may increase the transmission and reception area of the corresponding antenna member 115a, 115b, 115c, or 115d, and may reduce an entire height of the antenna module 10. Therefore, the antenna module 10 may have a structure in which the antenna module 10 can easily be miniaturized while having a high level of antenna performance.

Figure 3B:
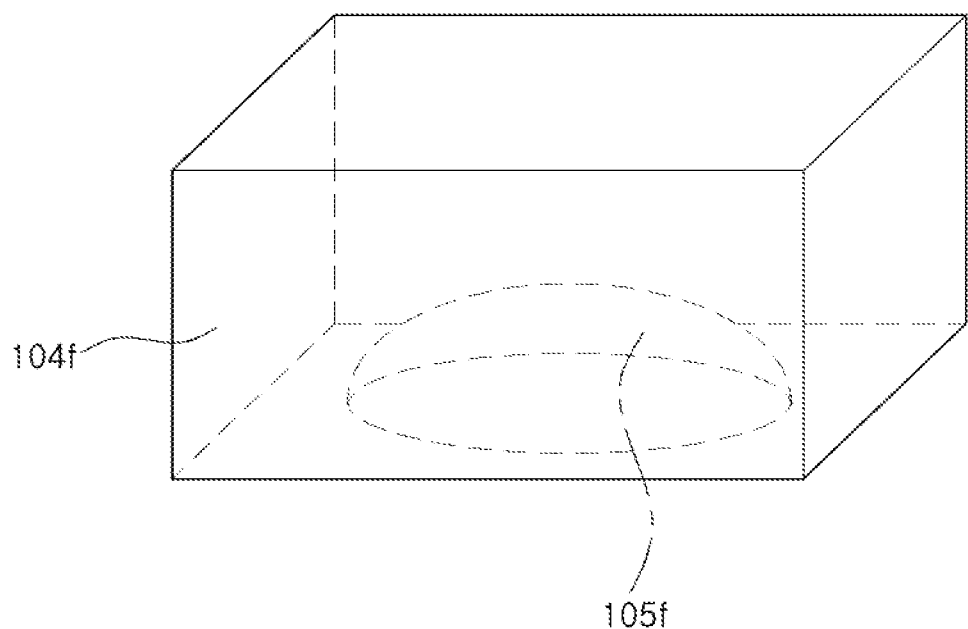
FIG. 3B is a view illustrating machining of a dielectric member using a molding machining method, according to an embodiment.
Figure 3C:
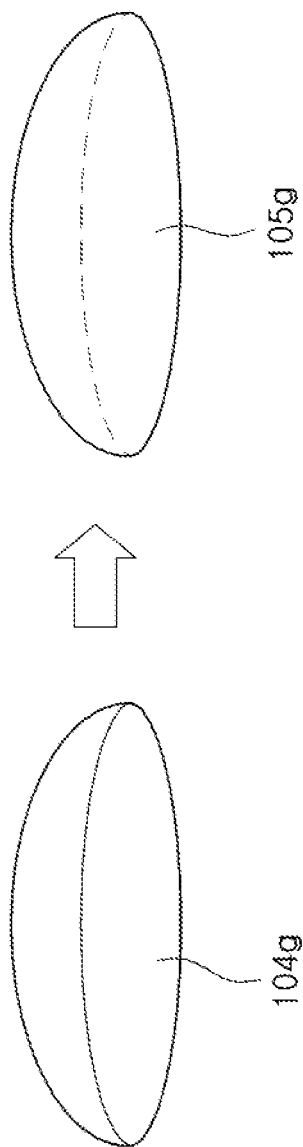
FIG. 3C is a view illustrating machining of a dielectric member using a lens cutting method, according to an embodiment.

FIGS. 3 through 3C are views illustrating machining of dielectric members.

Referring to FIG. 3A, the dielectric member 105e may be machined by cutting a dielectric block 104e.

Referring to FIG. 3B, a dielectric member 105f may be machined through a curing process from a dielectric powder injected into a mold 104f.

Referring to FIG. 3C, a dielectric member 105g may be machined through a middle cutting from a dielectric lens 104g.

The dielectric members 105a through 105d shown in FIGS. 1 and 2 may be formed by any of the machining operations described in FIGS. 3A through 3C. The dielectric members 105a through 105g described above may be formed of a material having a high dielectric constant Dk such as ABF, EMC, PPG, glass, ceramic, silicon, CCL, quartz, and teflon. In addition, an upper surface of the dielectric member 105a, 105b, 105xc, 105d, 105e, 105f, or 105g may be surface-treated for optimization of refraction/diffraction/reflection characteristics of the RF signal.

Figure 4:
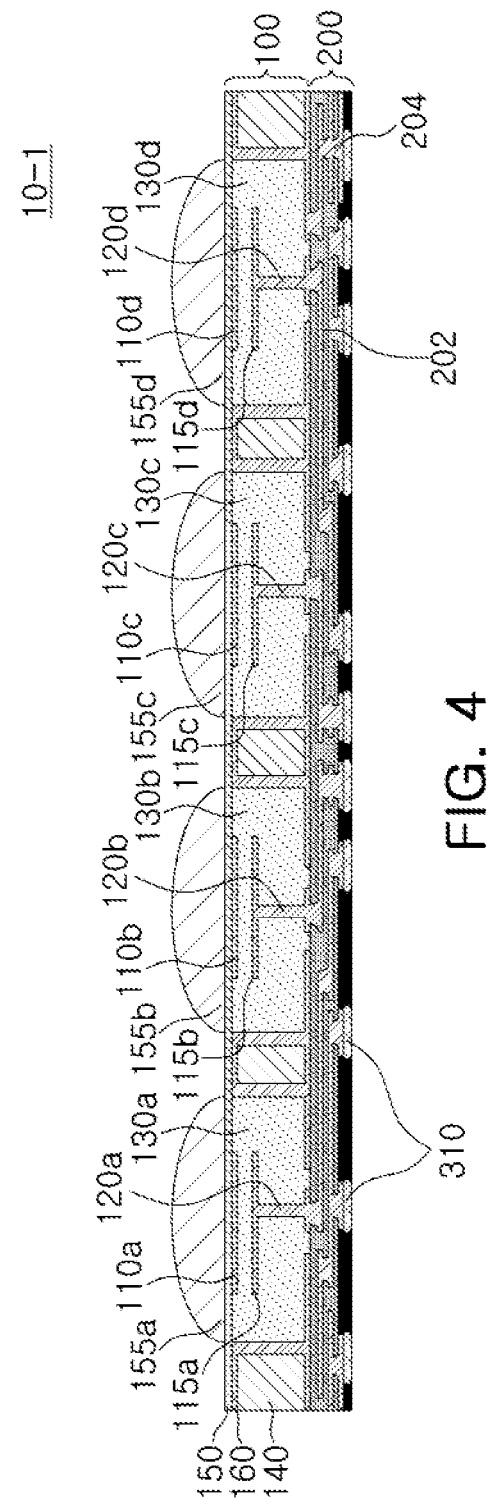
FIG. 4 is a view illustrating a dielectric member implemented as an encapsulation member in an antenna module, according to an embodiment.

FIG. 4 is a view illustrating dielectric members 155a, 155b, 155c, and 155d implemented as encapsulation members in an antenna module 10-1, according to an embodiment.

Referring to FIG. 4, the dielectric members 155a, 155b, 155c, and 155d may be formed of the same material (e.g., ABF, EMC, or PPG) as the encapsulation member 150.

The antenna module a10-1 may include, the connection member 200 including the at least one wiring layer 202 and the at least one insulating layer 204, the integrated circuit (IC) 300 (FIG. 1) disposed on the first surface of the connection member 200 and electrically connected to the at least one wiring layer 202, the antenna members 115a, 115b, 115c, and 115d configured to transmit or receive a radio frequency (RF) signal, the feed vias 120a, 120b, 120c, and 120d each having one end electrically connected to a respective antenna member 115a, 115b, 115c, or 115d and another end electrically connected to a corresponding wire of the at least one wiring layer 202, the plating member 160 disposed to surround a side of each of the feed vias 120a, 120b, 120c, and 120d, the insulating member 140 having a first surface disposed to face the second surface of the connection member 200, surrounding each of the antenna members 115a, 115b, 115c, and 115d, and having a height greater than a height of the at least one insulating layer 204, and a single dielectric member 150, 155a, 155b, 155c, and 155d disposed on the insulating member 140. A height of each of the regions corresponding to the antenna members 115a, 115b, 115c, and 115c may be greater than a height of the region corresponding to the insulating member 140.

The single dielectric member 150, 155a, 155b, 155c, and 155d may have a structure in which the dielectric members 155a, 155b, 155c, and 155d and the encapsulation member 150 are coupled to each other.

Figure 5C:
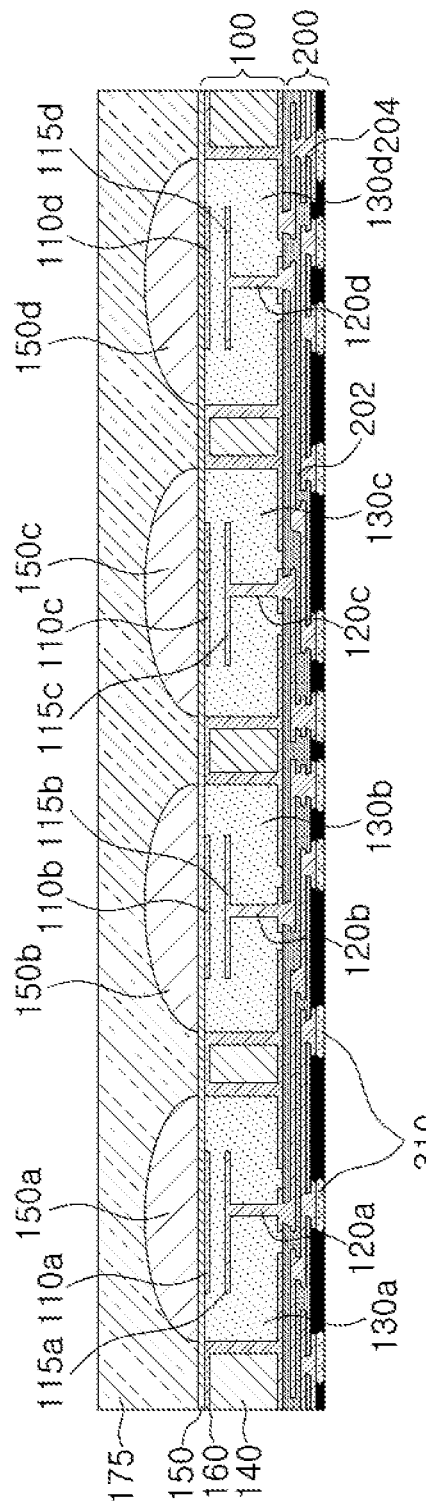

FIGS. 5A through 5C are views illustrating processes of manufacturing the antenna module 10-1 of FIG. 4.

Referring to FIG. 5A, a mold 175 may be disposed on the director members 110a, 110b, 110c, and 110d, and the plating member 160.

Referring to FIG. 5B, encapsulation members 150e before curing may be injected into regions in the mold 175 corresponding to a plurality of dielectric members.

Referring to FIG. 5C, as the encapsulation members 150e before curing are cured, the encapsulation members 150e before curing may be machined to dielectric members 155a, 155b, 155c, and 155d. In this case, the encapsulation member 150 may also be formed together with the dielectric members 155a, 155b, 155c, and 155d. Thereafter, the mold 175 may be separated from the encapsulation member 150 and the dielectric members 155a, 155b, 155c, and 155d.

Depending on a design, the encapsulation members 150e before curing may be compressed on the director members 110a, 110b, 110c, and 110d, and the plating member 160 together with the mold 175. In this example, a lamination method may be used, but the method for compressing the encapsulation member 150e before curing is not limited to a lamination method.

Figure 6:
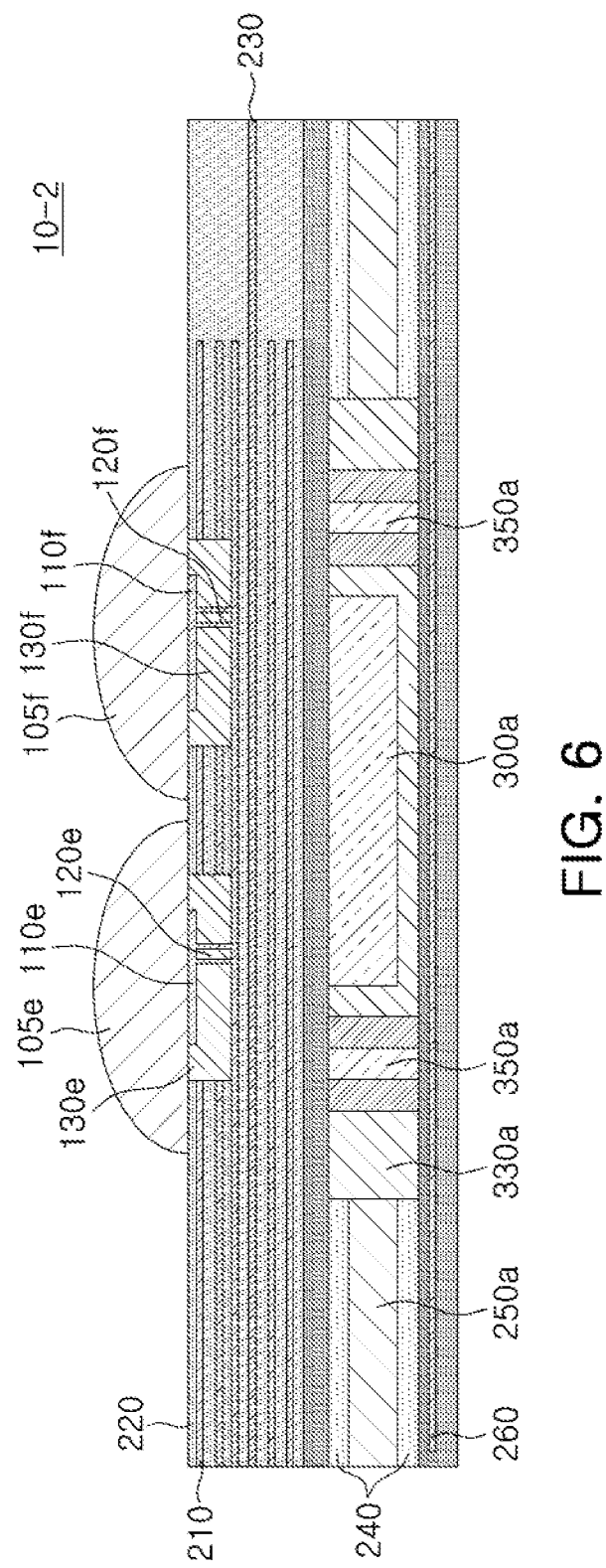
FIG. 6 is a view illustrating a second directional antenna member of an antenna module, according to an embodiment.

FIG. 6 is a view illustrating another example and a second directional antenna member 230 of an antenna module 10-2, according to an embodiment.

Referring to FIG. 6, the antenna module 10-2 may include at least a portion of dielectric members 105e and 105f, antenna members 110e and 110f, feed vias 120e and 120f, dielectric layers 130e and 130f, at least one wiring layer 210, at least one insulating layer 220, a second directional antenna member 230, a core insulating layer 240, a core member 250a, a shielding layer 260, an IC 300a, an encapsulant 330a, and a passive component 350a.

A Cavities in which each of the antenna members 110e and 110f, each of the feed vias 120e and 120f, and each of the dielectric layers 130e and 130f are disposed may be implemented through an appropriate design (e.g., a through region layout) of the wiring layer 210.

The second directional antenna member 230 may be disposed to be adjacent to a side surface of the antenna module 10-2, and may transmit and receive a second RF signal in a side surface direction. For example, the second directional antenna member 230 may have a dipole form or a monopole form.

The shielding layer 260 may be formed on a lower surface of the antenna module to electromagnetically protect the IC 300a.

The IC 300a may include at least one of an RFIC generating an RF signal and a PMIC generating power. In order to reduce an electrical distance between the PMIC and the passive component 350a, the passive component 350a may also be disposed to be adjacent to the IC 300a.

The encapsulant 330a may encapsulate at least a portion of the IC 300a to protect the IC 300a from an external environment. For example, the encapsulant 330a may be formed of a photo imageable encapsulant (PIE), Ajinomoto build-up film (ABF), epoxy molding compound (EMC), or the like, but is not limited thereto.

The core insulating layer 240 and the core member 250a may be implemented according to a fan-out semiconductor package to be described below with reference to FIGS. 18 through 25.

Figure 7:
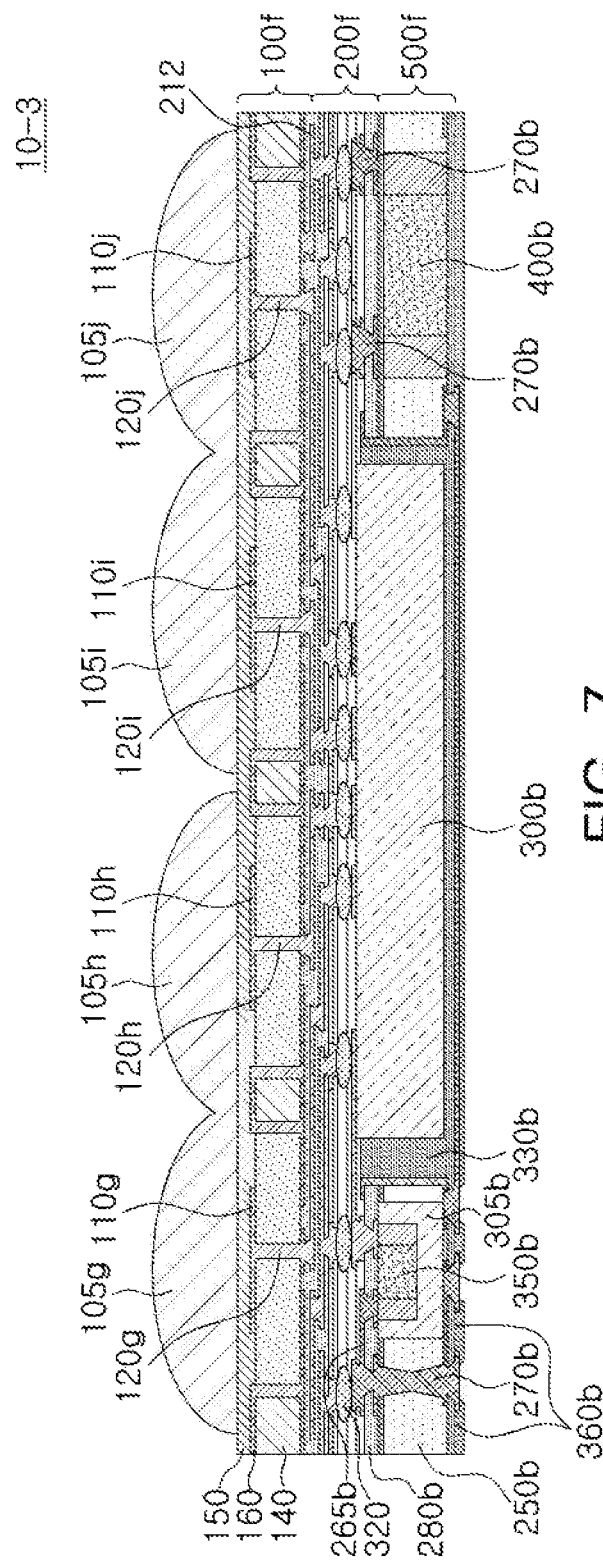
FIG. 7 is a view illustrating a fan-out semiconductor package of an antenna module, according to an embodiment.

FIG. 7 is a view illustrating another example and a fan-out semiconductor package 500f of an antenna module 10-3, according to an embodiment.

Referring to FIG. 7, the antenna module 10-3 may include at least a portion of dielectric members 105g, 105h, 105i, and 105j, antenna members 110g, 110h, 110i, and 110j, feed vias 120g, 120h, 120i, and 120j, core members 250b and 400b, a core via 270b, an IC 300b, an encapsulant 330b, and a passive component 350b.

Depending on a design, at least a portion of the dielectric members 105g, 105h, 105i, and 105j may be coupled to an adjacent dielectric member. That is, an area in a horizontal direction of the plurality of dielectric members 105g, 105h, 105i, and 105j is not particularly limited.

The core member 250b may include a core via 270b electrically connected to a corresponding wire of at least one wiring layer 212 of a connection member 200f, a core insulating layer 280b surrounding a side surface of the core via 270b, and a core wiring layer 265b disposed on a first surface or a second surface of the core insulating layer 280b and electrically connected to the core via 270b.

For example, the core via 270b may receive a base signal or power from a lower end of the antenna module 10-3 and may transmit the base signal to the IC 300b through the core wiring layer 265b and/or the connection member 200f. Thereafter, the IC 300b may generate an RF signal of a millimeter wave (mmWave) band based on the received base signal and/or power.

In addition, the core member 250b may be disposed on a first surface or a second surface of the connection member 200f and may provide an accommodation space 305b. The passive component 350b may be disposed in the accommodation space 305b and may be electrically connected to the core wiring layer 265b.

An antenna package 100f may be disposed on an upper surface of the connection member 200f, and a fan-out semiconductor package 500f may be disposed on a lower surface of the connection member 200f. That is, the fan-out semiconductor package 500f may include the encapsulant 330b and the core members 250b and 400b, and may be implemented according to a fan-out semiconductor package to be described below with reference to FIGS. 18 through 25.

Figure 8:
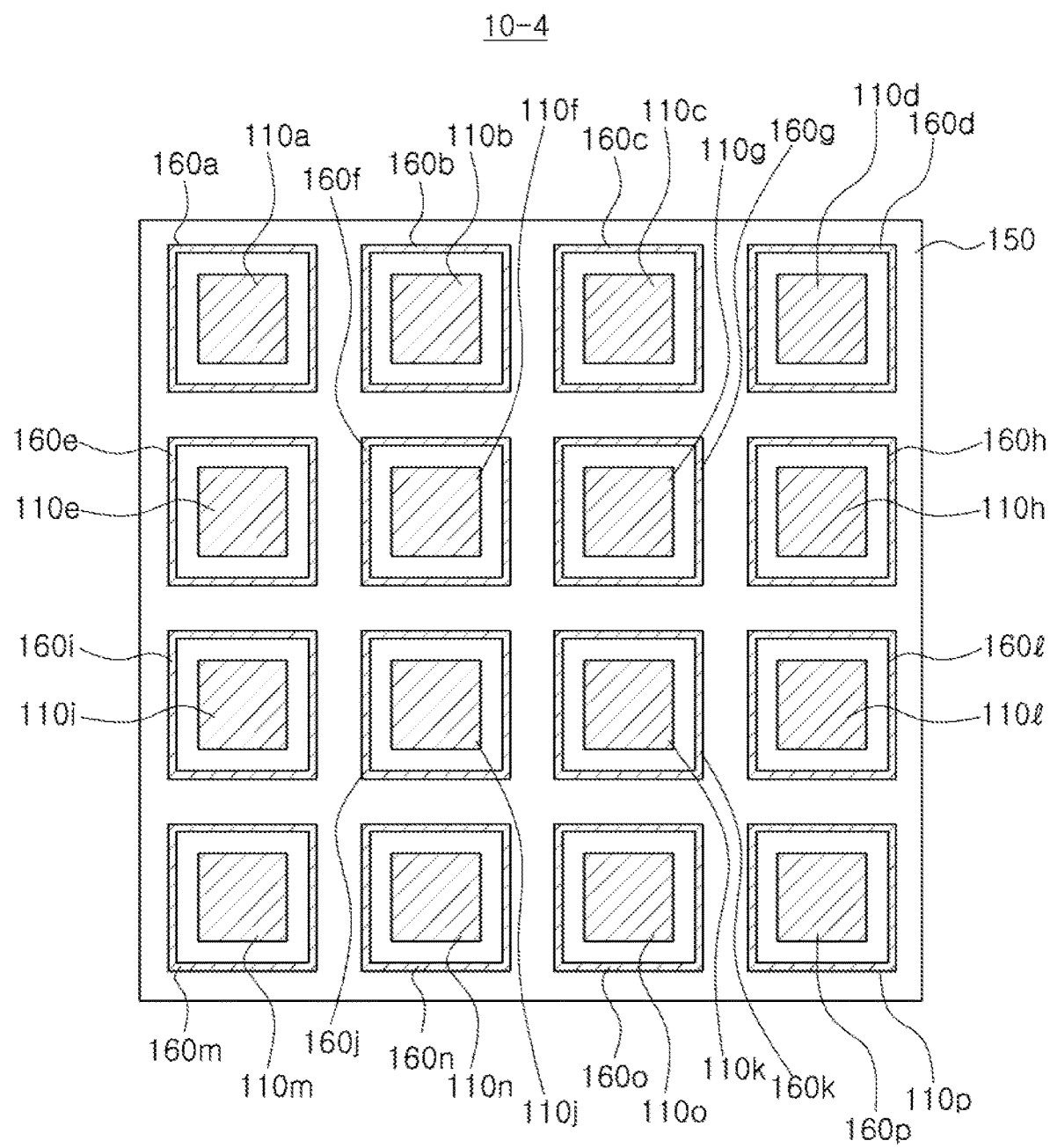
FIG. 8 is a view illustrating an upper surface of an antenna module, according to an embodiment.

FIG. 8 is a view illustrating an upper surface of an antenna module 10-4, according to an embodiment.

Referring to FIG. 8, each of director members 110a, 110b, 110c, 110d, 110e, 110f, 110g, 110h, 110i, 110j, 110k, 110l, 110m, 110n, 110o, and 110p may have a form of a patch antenna and may be surrounded by a corresponding plating member among plating members 160a, 160b, 160c, 160d, 160e, 160f, 160g, 160h, 160i, 160j, 160k, 160l, 160m, 160n, 160o, and 160p. If the antenna module 10-4 does not include the director members 110a, 110b, 110c, 110d, 110e, 110f, 110g, 110h, 110i, 110j, 110k, 110l, 110m, 110n, 110o, and 110p, the director members 110a, 110b, 110c, 110d, 110e, 110f, 110g, 110h, 110i, 110j, 110k, 110l, 110m, 110n, 110o, and 110p may be replaced with antenna members.

Figure 9:
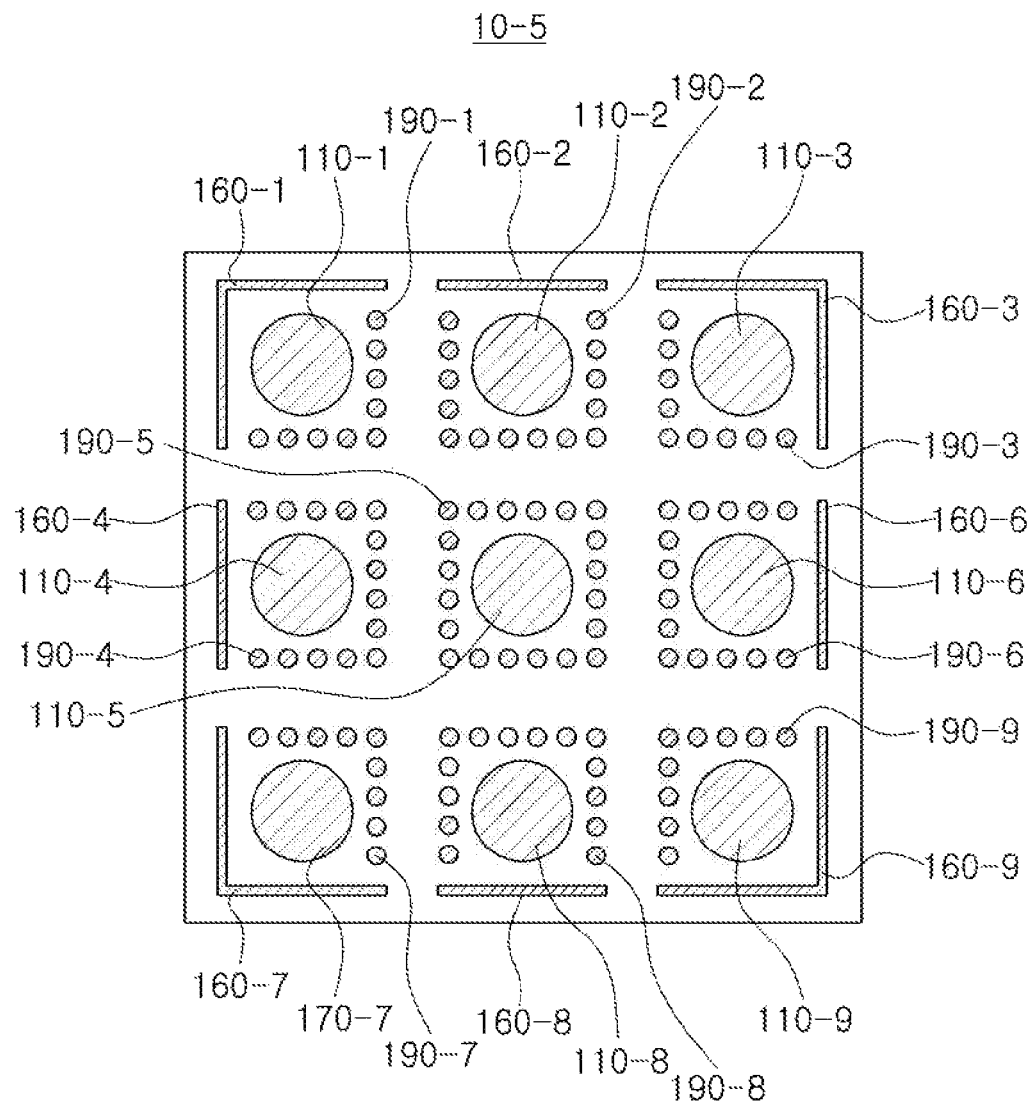
FIG. 9 is a view illustrating an upper surface of an antenna module, according to an embodiment.

FIG. 9 is a view illustrating an upper surface of an antenna module 10-5, according to an embodiment.

Referring to FIG. 9, each of director members 110-1, 110-2, 110-3, 110-4, 110-5, 110-6, 110-7, 110-8, and 110-9 may be surrounded by at least one of corresponding plating members 160-1, 160-2, 160-3, 160-4, 160-5, 160-6, 160-7, 160-8, and 160-9, and shielding members 190-1, 190-2, 190-3, 190-4, 190-5, 190-6, 190-7, 190-8, and 190-9. If the antenna module 10-5 does not include the director members 110-1, 110-2, 110-3, 110-4, 110-5, 110-6, 110-7, 110-8, and 110-9, the director members 110-1, 110-2, 110-3, 110-4, 110-5, 110-6, 110-7, 110-8, and 110-9 may be replaced with antenna members.

The number, layout, and shape of the director members illustrated in FIGS. 8 and 9 are not particularly limited. For example, the shape of the director members 110a, 110b, 110c, 110d, 110e, 110f, 110g, 110h, 110i, 110j, 110k, 110l, 110m, 110n, 110o, and 110p illustrated in FIG. 8 may be a circular shape, and the number of the director members 110-1, 110-2, 110-3, 110-4, 110-5, 110-6, 110-7, 110-8, and 110-9 illustrated in FIG. 9 may be four.

Figure 10A:
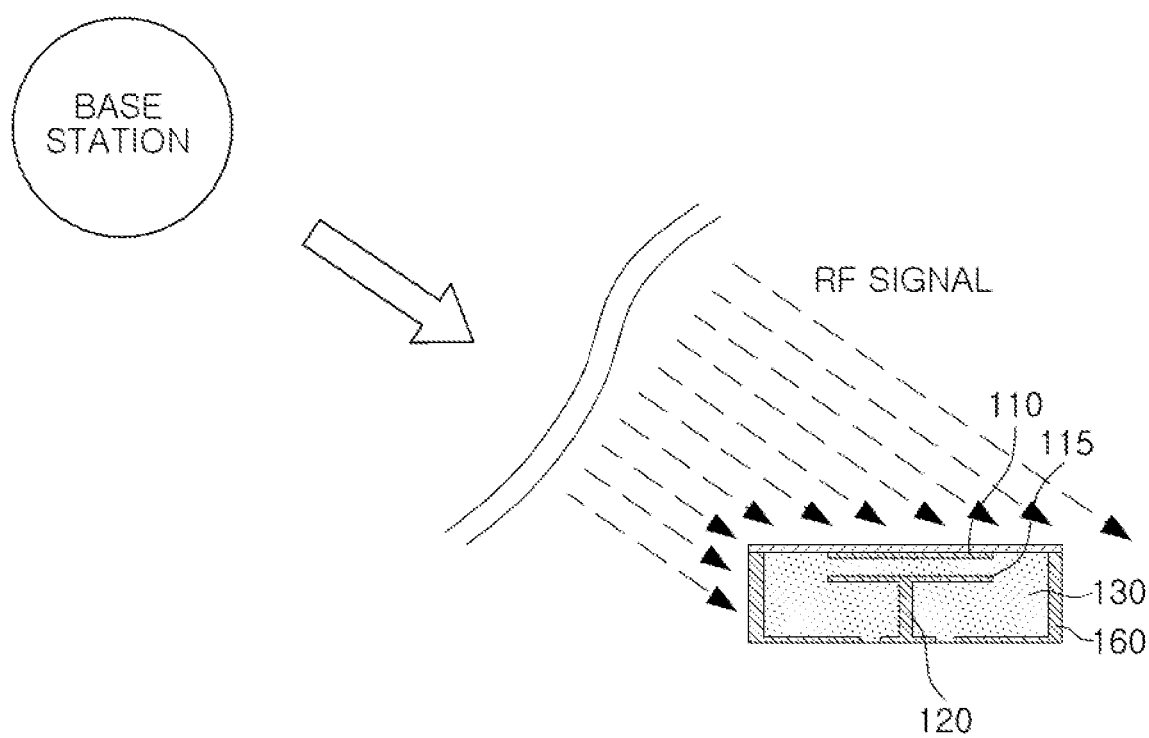
FIG. 10A is a view illustrating an oblique angle transmission and reception area of an antenna module in which a dielectric member is not disposed, according to an embodiment.
Figure 10B:
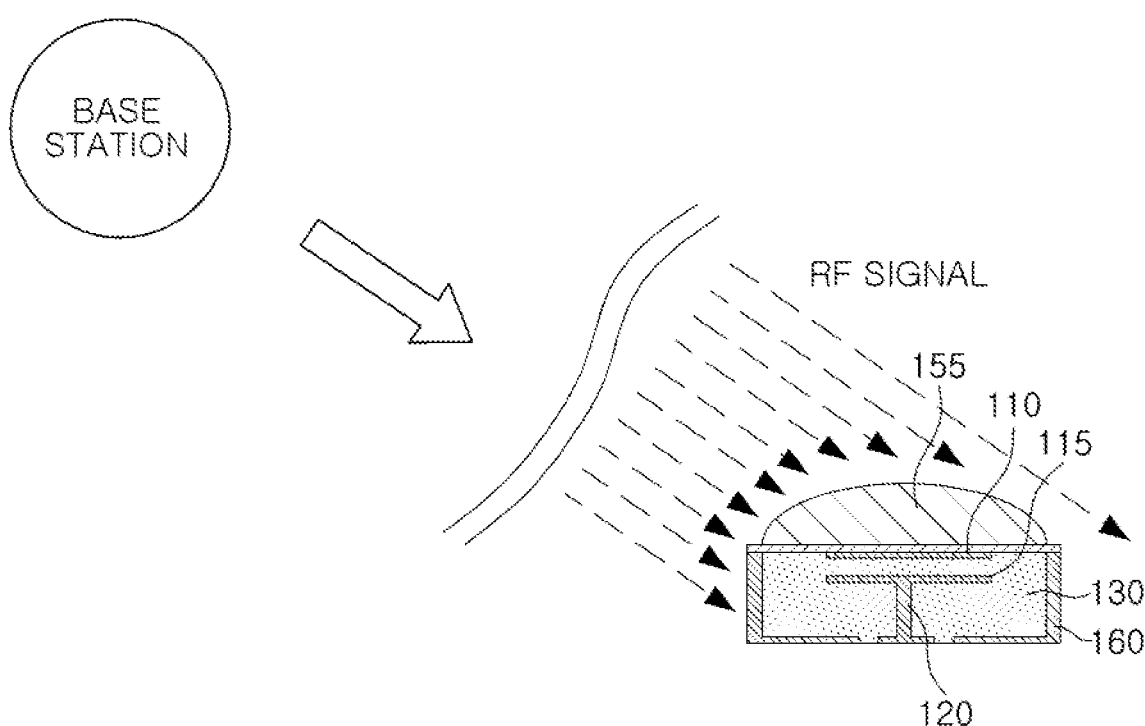
FIG. 10B is a view illustrating an oblique angle transmission and reception area of an antenna module in which a dielectric member is disposed, according to an embodiment.

FIG. 10A is a view illustrating an oblique angle transmission and reception area of an antenna module including the antenna member 115, and in which a dielectric member is not disposed. FIG. 10B is a view illustrating an oblique angle transmission and reception area of an antenna module including the antenna member 115, and in which a dielectric member 155 is disposed.

Referring to FIGS. 10A and 10B, the dielectric member 155 may increase an oblique angle transmission and reception area of the antenna module. In addition, the RF signal incident into the dielectric member 155 may be refracted at a boundary of the dielectric member 155 according to a dielectric constant of the dielectric member 155. Therefore, a transmission and reception rate or a gain of the antenna module may be improved.

Figure 11A:
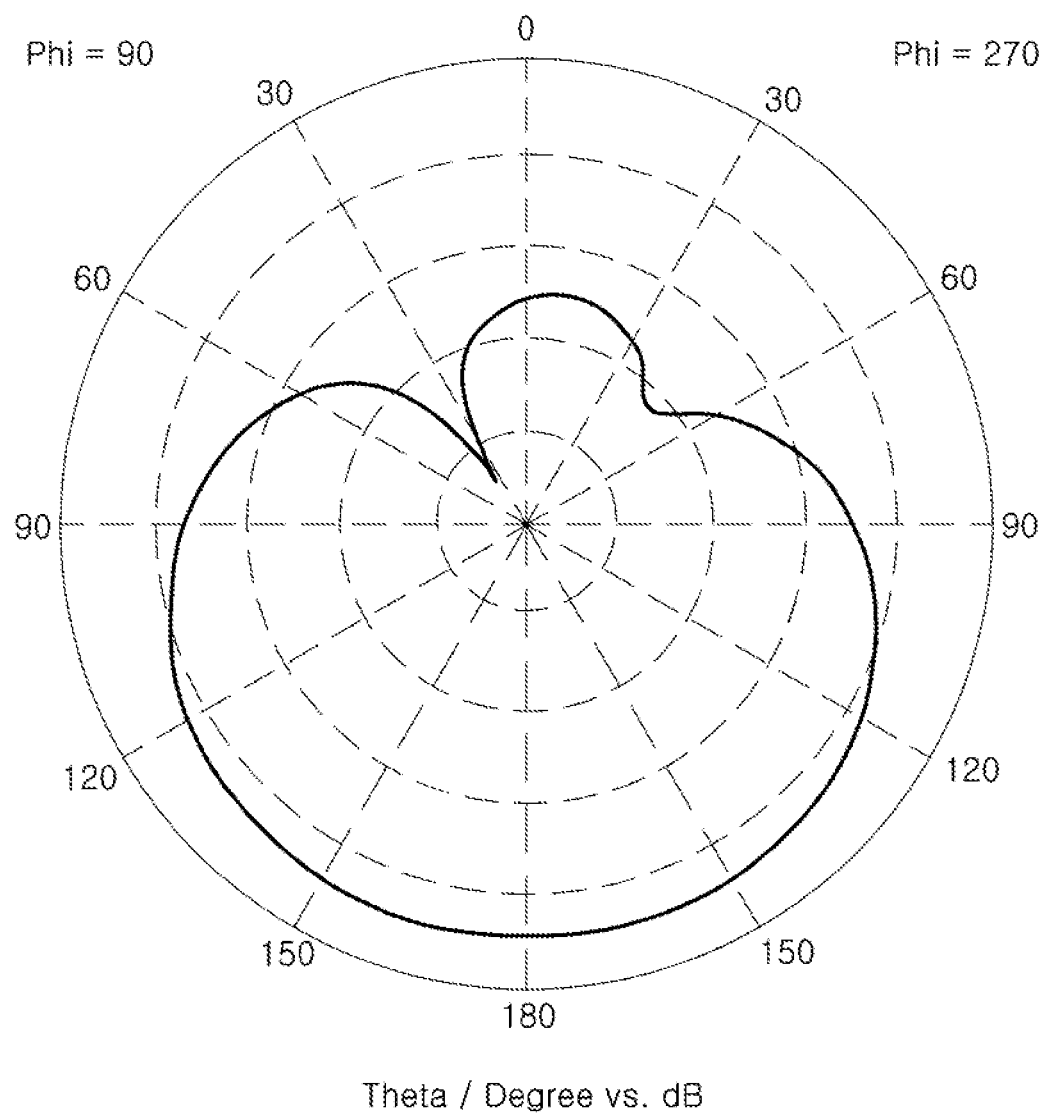
FIG. 11A is a view illustrating a radiation pattern of an antenna member, according to an embodiment.
Figure 11B:
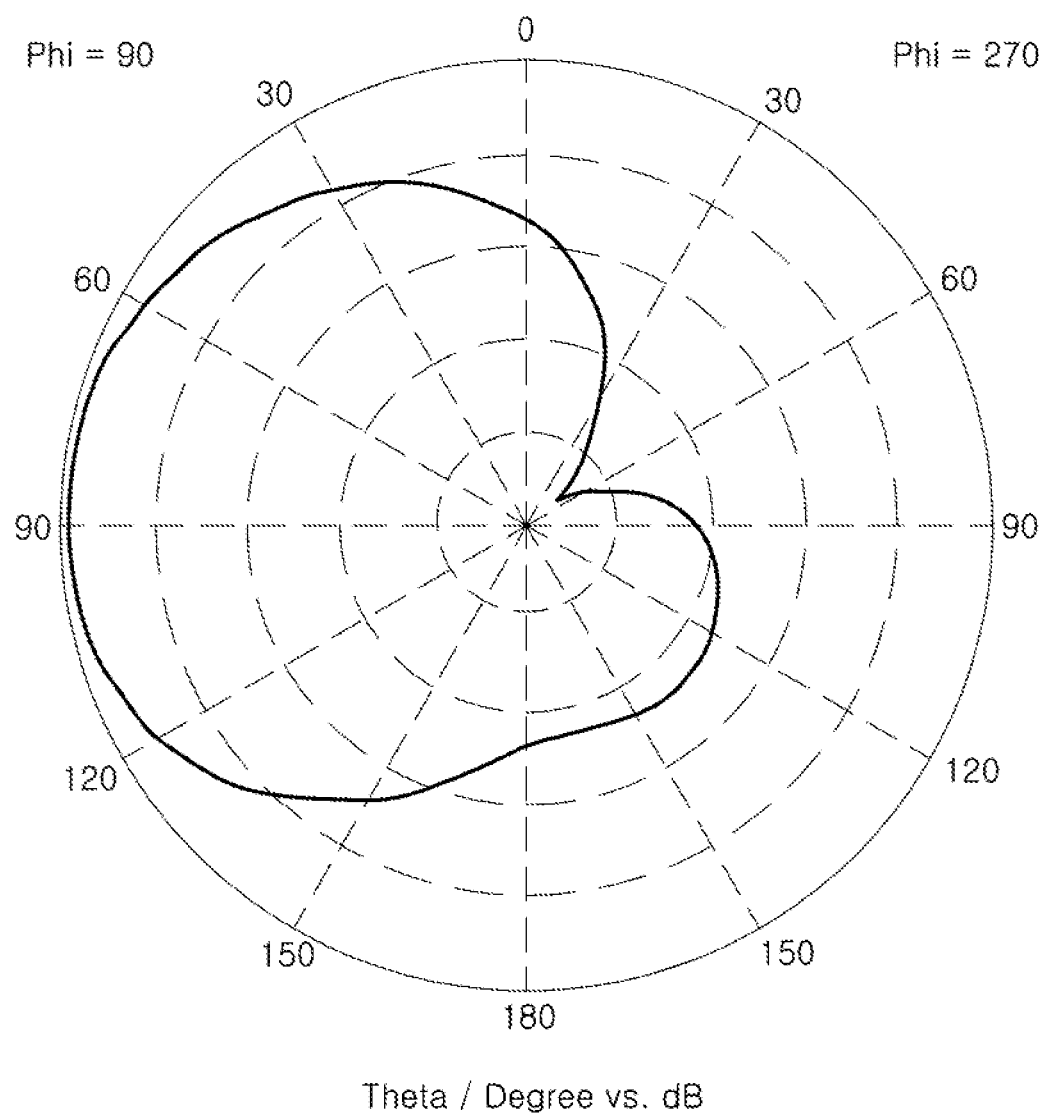
FIG. 11B is a view illustrating a radiation pattern of a second directional antenna member, according to an embodiment.

FIG. 11A is a view illustrating a radiation pattern of an antenna member, according to an embodiment. FIG. 11B is a view illustrating a radiation pattern of a second directional antenna member, according to an embodiment.

Referring to FIGS. 11A and 11B, the antenna module may include a patch antenna corresponding to the antenna member 115 described above in FIGS. 10A and 10B, and a dipole antenna corresponding to the second directional 230 (FIG. 6) member described above.

The patch antenna may form the radiation pattern to an upper surface (Theta=180) of an electronic device, and the dipole antenna may form the radiation pattern to a side surface (Theta=90) of the electronic device.

The electronic device in which both the patch antenna and the dipole antenna are disposed may have all of the radiation pattern of the patch antenna and the radiation pattern of the dipole antenna. Since a gain of the patch antenna is greater than a gain of the dipole antenna, transmission and reception performance of the side surface of the electronic device may be lower than the transmission and reception performance of the upper surface of the electronic device.

An antenna module according to embodiments disclosed herein may increase the radiation pattern of the side surface of the pattern antenna. Therefore, a radiation direction of the electronic device in which the antenna module according to a disclosed embodiment is disposed may be more stable, and the electronic device may efficiently expand the transmission and reception direction of the RF signal in an omni-direction.

Figure 12A:
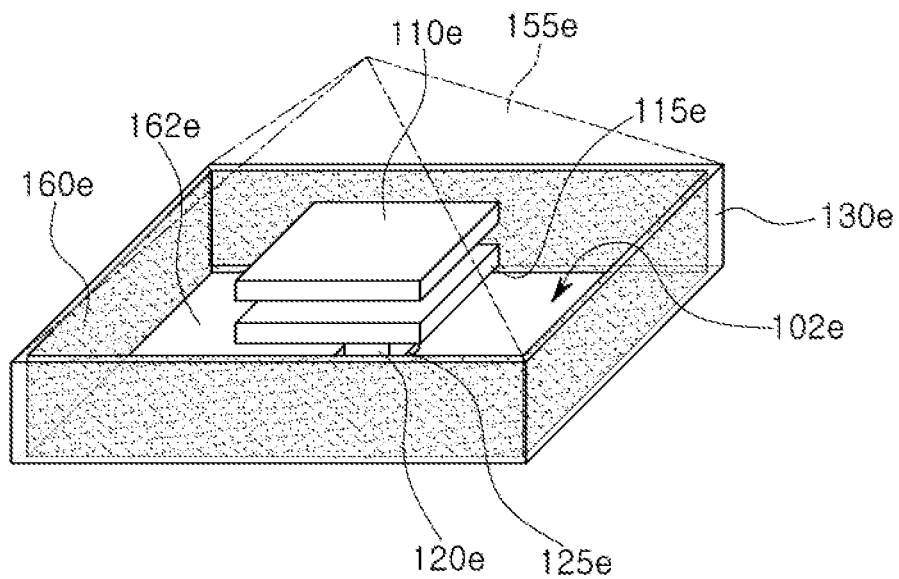
FIG. 12A is an enlarged perspective view of an example of a cavity and a dielectric member of an antenna module, according to an embodiment.

FIG. 12A is an enlarged perspective view of an example of a cavity 102e and a dielectric member 155e of an antenna module, according to an embodiment.

Referring to FIG. 12A, the cavity 102e may include at least a portion of a director member 110e, an antenna member 115e, a feed via 120e, an electrical connection structure 125e, a dielectric layer 130e, and a plating member 160e. The plating member 160e may be disposed to surround side surfaces of the cavity 102e. That is, a lower surface of the cavity 102e may be covered by a ground pattern 162e disposed on the upper surface of the connection member (e.g., the connection member 200f in FIG. 7).

In addition, the dielectric member 155e may be disposed on the cavity 102 and may have a polypyramidal form.

Figure 12B:
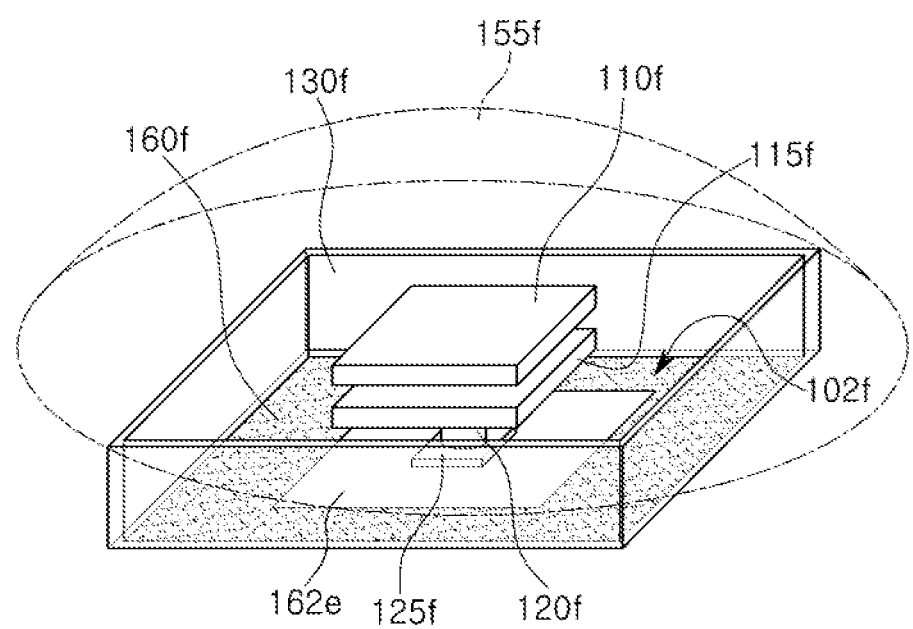
FIG. 12B is an enlarged perspective view of another example of a cavity and a dielectric member of an antenna module, according to an embodiment.

FIG. 12B is an enlarged perspective view of another example of a cavity 102f and a dielectric member 155f of an antenna module, according to an embodiment.

Referring to FIG. 12B, the cavity 102f may include at least a portion of a director member 110f, an antenna member 115f, a feed via 120f, an electrical connection structure 125f, a dielectric layer 130f, and a plating member 160f. In this example, the plating member 160f may be disposed to cover a portion of the lower surface of the cavity 102f. The side surfaces of the cavity 102f may be surrounded by the plating member 160e (FIG. 12A) disposed on side surfaces of an insulating member on the connection member (e.g., the connection member 200f in FIG. 7).

In addition, the dielectric member 155f may be disposed on the cavity 102f and may have a form of a semi-convex lens.

Figure 12C:
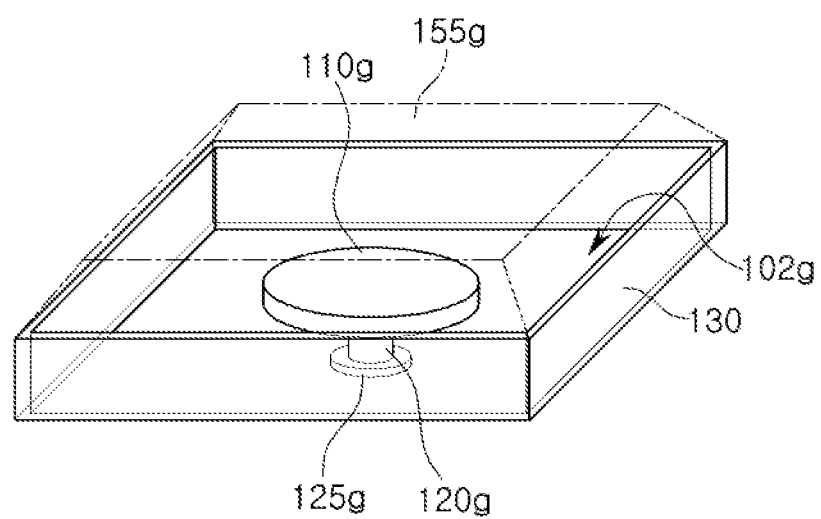
FIG. 12C is an enlarged perspective view of another example of a cavity and a dielectric member of an antenna module, according to an embodiment.

FIG. 12C is an enlarged perspective view of another example of a cavity 102g and a dielectric member 155g of an antenna module, according to an embodiment.

Referring to FIG. 12C, the cavity 102g may include at least a portion of an antenna member 110g, a feed via 120g, an electrical connection structure 125g, and a dielectric layer 130g. That is, the side surfaces of the cavity 102g may be surrounded by the plating member 160e (FIG. 12A) disposed on the side surfaces of the insulating member on the connection member, and the lower surface of the cavity may be covered by the ground pattern 162e (FIG. 12A) disposed on the upper surface of the connection member.

In addition, the dielectric member 155g may be disposed on the cavity and may have a form of an asymmetrical polygon.

FIG. 13 is a view illustrating a structure in which dielectric layers 130a, 130b, 130c, and 130d and dielectric members of an antenna module 10-6, according to an embodiment, are integrated.

Referring to FIG. 13, the antenna module 10-6 may include an antenna package 100b and a connection member 200b. Dielectric layers 130a, 130b, 130c, and 130d included in the antenna package 100b may be integrated with the dielectric members described above.

That is, each of the dielectric layers 130a, 130b, 130c, and 130d may have a height greater than a height of the insulating member 140 and may not include an encapsulation member depending on a design. The dielectric layers 130a, 130b, 130c, and 130d may have a dielectric constant greater than the dielectric constant of the insulating layer of the connection member 200b or the insulating member 140.

FIG. 14 is a view illustrating a structure in which director members 110a, 110b, 110c, and 110d of an antenna module 10-7, according to an embodiment, are disposed on the dielectric members 155a, 155b, 155c, and 155d.

Referring to FIG. 14, the antenna module 10-7 may include an antenna package 100c and a connection member 200c. Each of the dielectric members 155a, 155b, 155c, and 155d disposed on the antenna package 100c may include a respective one of the director members 110a, 110b, 110c, and 110d.

That is, since the director members 110a, 110b, 110c, and 110d may be manufactured independently from the antenna members 115a, 115b, 115c, and 115d or may be more easily disposed in the antenna module 10-7, a positional relationship (e.g., a spaced distance, a horizontal alignment, a size difference, and/or a thickness difference) of the antenna members 115a, 115b, 115c, and 115c to the director members 110a, 110b, 110c, and 110d may be more accurately matched during the manufacturing process. Accordingly, performance of the antenna module 10-7 may be further improved.

Figure 15:
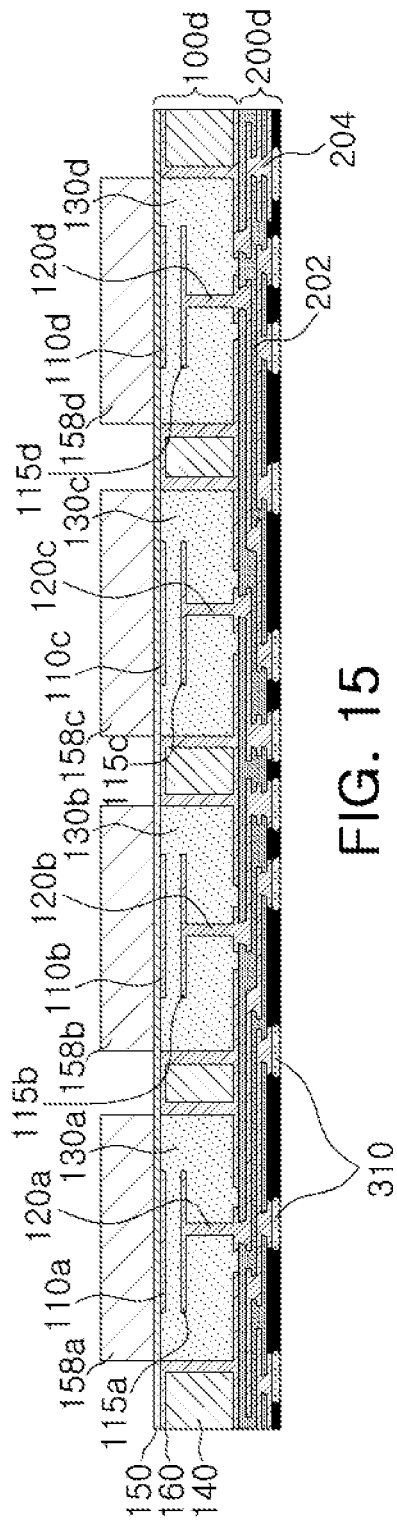
FIG. 15 is a view illustrating dielectric members of an antenna module, according to an embodiment.

FIG. 15 is a view illustrating an example of dielectric members 158a, 158b, 158c, and 158d of an antenna module 10-8, according to an embodiment.

Referring to FIG. 15, the antenna module 10-8 may include an antenna package 100d and a connection member 200d. Each of the dielectric members 158a, 158b, 158c, and 158d disposed on the antenna package 100d may have a block form.

That is, since the dielectric members 158a, 158b, 155c, and 158d may be disposed on the antenna package 100d without being machined by the mechanical machining method illustrated in FIG. 3A, the molding machining method illustrated in FIG. 3B, or the lens cutting machining method illustrated in FIG. 3C, a detailed form of the dielectric members 158a, 158b, 158c, and 158d is not particularly limited.

Figure 16:
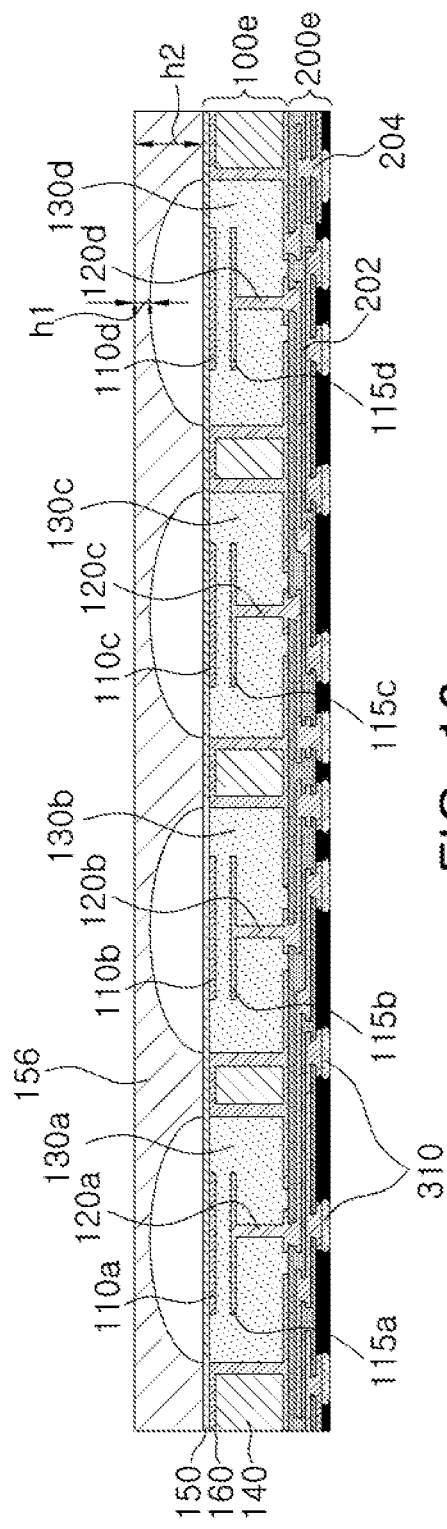
FIG. 16 is a view illustrating a dielectric member of an antenna module, according to an embodiment.

FIG. 16 is a view illustrating another example of a dielectric member 156 of an antenna module 10-9, according to an embodiment.

Referring to FIG. 16, the antenna module 10-9 may include an antenna package 100e and a connection member 200e. A dielectric member 156 disposed on the antenna package 100e may have a concave surface (a lower surface in FIG. 16) of a form of hemisphere or a form of a semi-convex lens in each of the regions corresponding to the antenna members 115a, 115b, 115c, and 115d.

That is, the dielectric member 156 may be configured so that a height h1 of the dielectric member in each of the regions corresponding to the antenna members 115a, 115b, 115c, and 115d is less than a height h2 of the dielectric member 156 in the region corresponding to the insulating member 140. An RF signal passing through the dielectric member 156 may be refracted on the concave surface.

Figure 17:
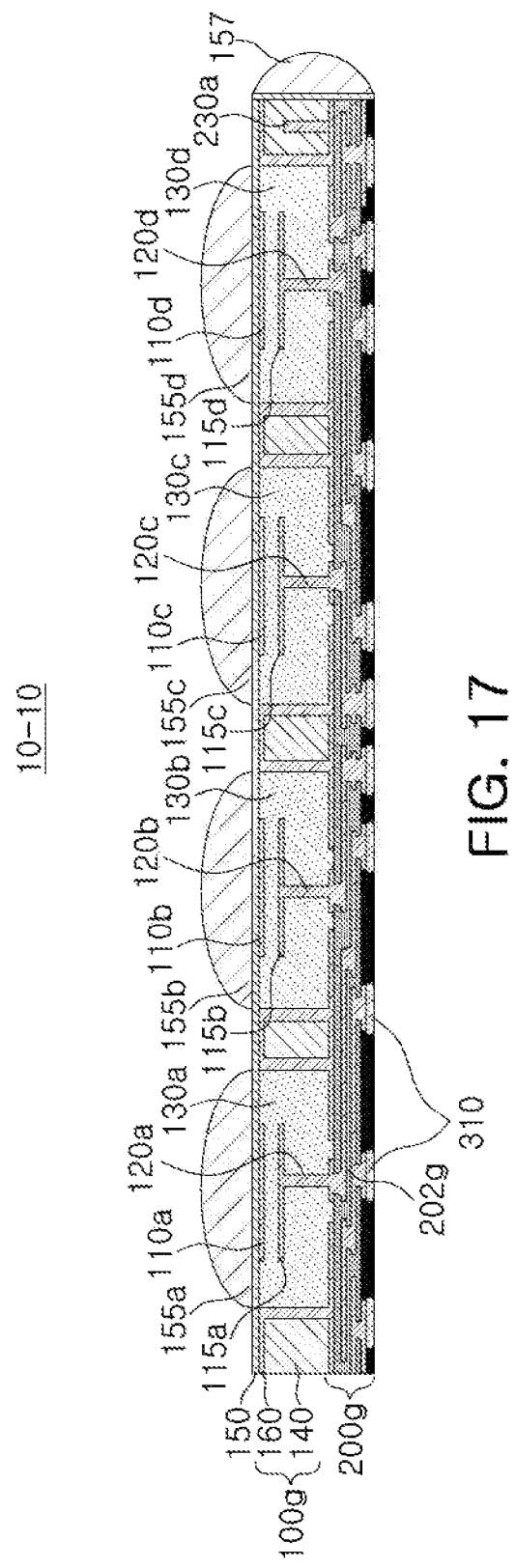
FIG. 17 is a view illustrating a second directional antenna member and a second directional dielectric member of an antenna module, according to an embodiment.

FIG. 17 is a view illustrating a second directional antenna member 230a and a second directional dielectric member 157 of an antenna module 10-10, according to an embodiment.

Referring to FIG. 17, an antenna package 100g of an antenna module 10-10, according to an embodiment, may further include at least one second directional antennal member 230a electrically connected to a wiring layer 202g of a connection member 200g and configured to transmit or receive a second RF signal to or from a third surface of the antenna package 100g (a side surface in FIG. 17).

In this example, the antenna module 10-10 may further include the second directional dielectric member 157 disposed on the third surface of the antenna package 100g. The antenna module 10-10 may further transmit and receive an RF signal which is obliquely incident from the lower surface of the antenna module 10-10 through the second directional dielectric member 157. Accordingly, a radiation direction of an electronic device in which the antenna module 10-10 is disposed may be more stable, and the electronic device may efficiently expand the transmission and reception direction of the RF signal in an omni-direction.

The lower end (corresponding to the IC, the encapsulant, the passive component, and the core via) of the connection member 200g disclosed in the present specification may be implemented according to a fan-out semiconductor package. To facilitate understanding of the fan-out semiconductor package, a description will be made with reference to FIGS. 18 through 25.

Figure 18:
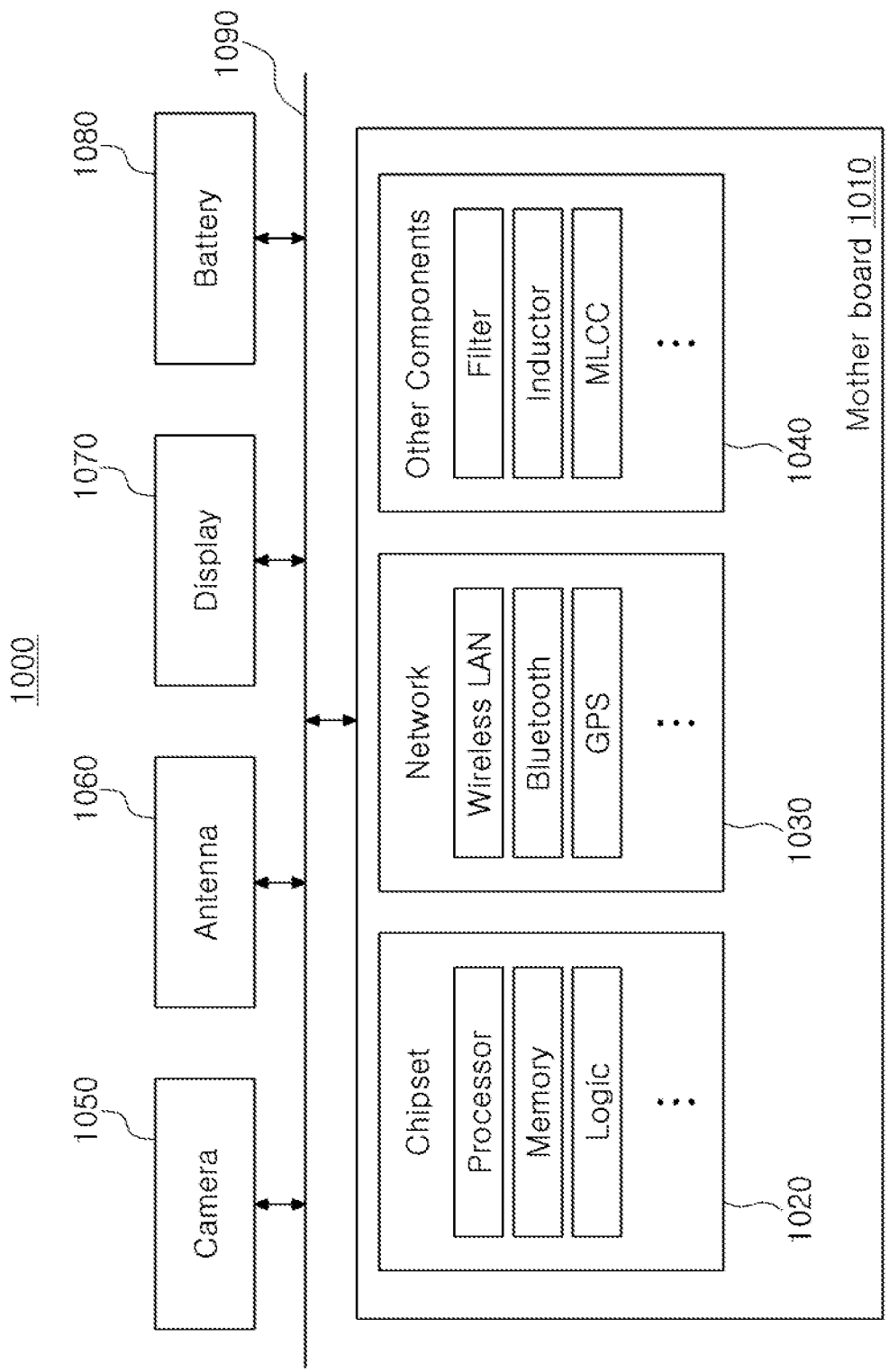
FIG. 18 is a schematic block diagram illustrating an example of an electronic device system.

FIG. 18 is a schematic block diagram illustrating an example of an electronic device system 1000.

Referring to FIG. 18, the electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, or an automotive component. However, the electronic device 1000 is not limited to these examples, and may be any other electronic device configured to process data.

Figure 19:
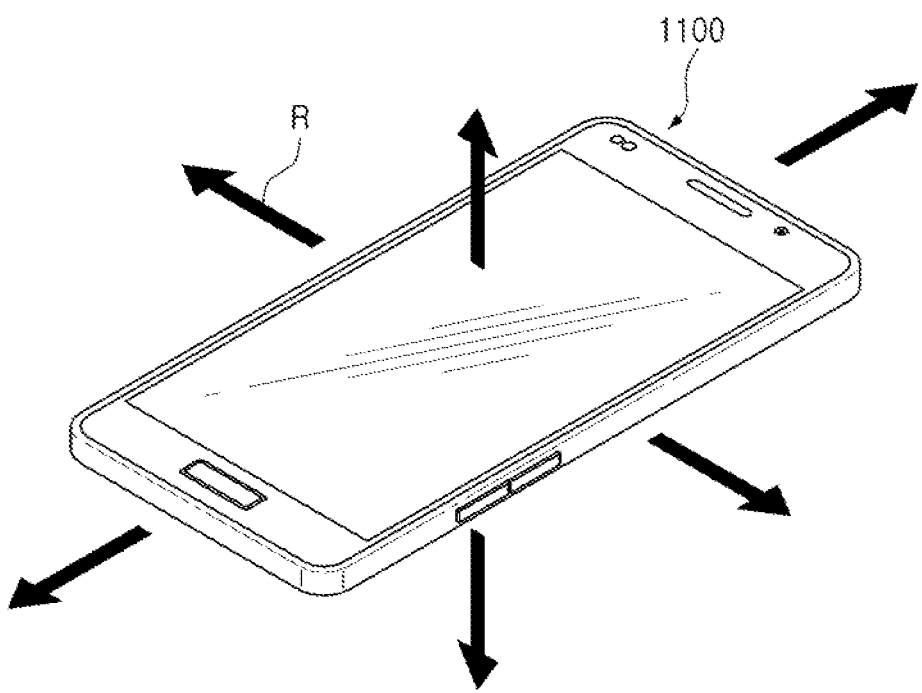
FIG. 19 is a schematic perspective view illustrating an example of an electronic device.

FIG. 19 is a schematic perspective view illustrating an example of an electronic device 1100.

Referring to FIG. 19, the electronic device 1100 may be, for example, a smartphone. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone 1100.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip may not be used alone, but may be packaged and used in an electronic device in a packaged state.

Semiconductor packaging may be required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose of the semiconductor package.

A fan-in semiconductor package and a fan-out semiconductor package will hereinafter be described in more detail with reference to the drawings.

Figure 21:
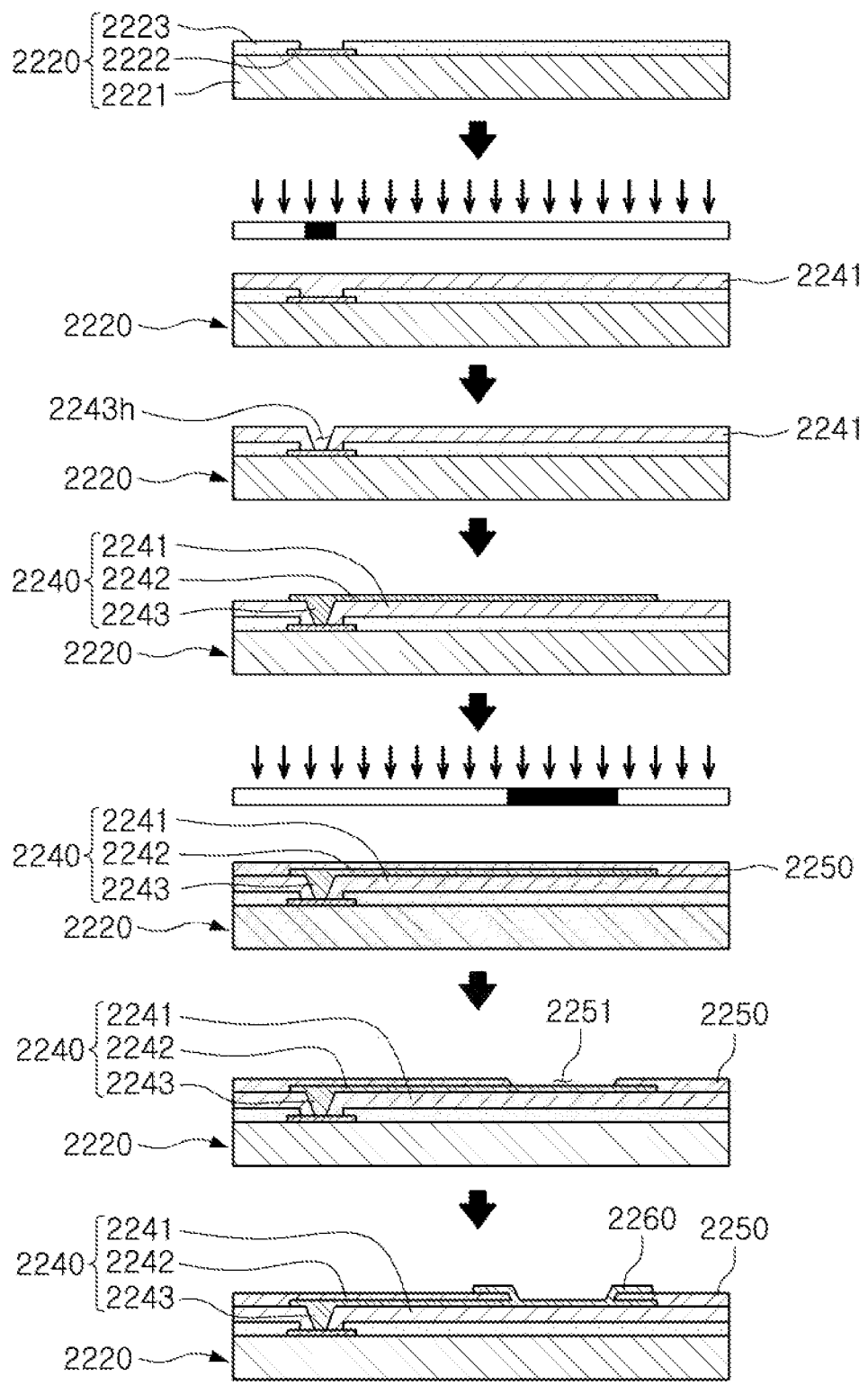
FIG. 21 is schematic cross-sectional views illustrating a packaging process of a fan-in semiconductor package, according to an embodiment.

FIGS. 20A and 20B are schematic cross-sectional views illustrating states of a fan-in semiconductor package 2200 before and after being packaged, according to an embodiment. FIG. 21 is schematic cross-sectional views illustrating a packaging process of the fan-in semiconductor package 2200, according to an embodiment.

Referring to FIGS. 20A, 20B and 21, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this example, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimageable dielectric (PID) resin, forming via holes 2243h (FIG. 21) opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, the fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package 2200 may have a package form in which all of the connection pads 2222, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 22:
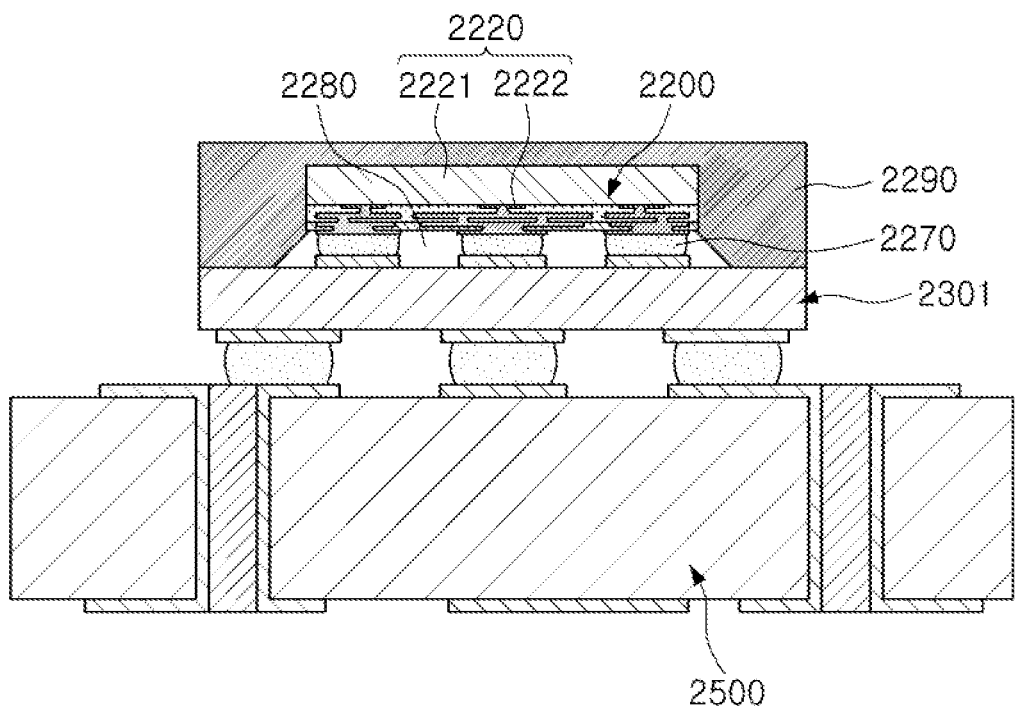
FIG. 22 is a schematic cross-sectional view illustrating an example in which a fan-in semiconductor package is mounted on an interposer substrate and is finally mounted on a main board of an electronic device.
Figure 23:
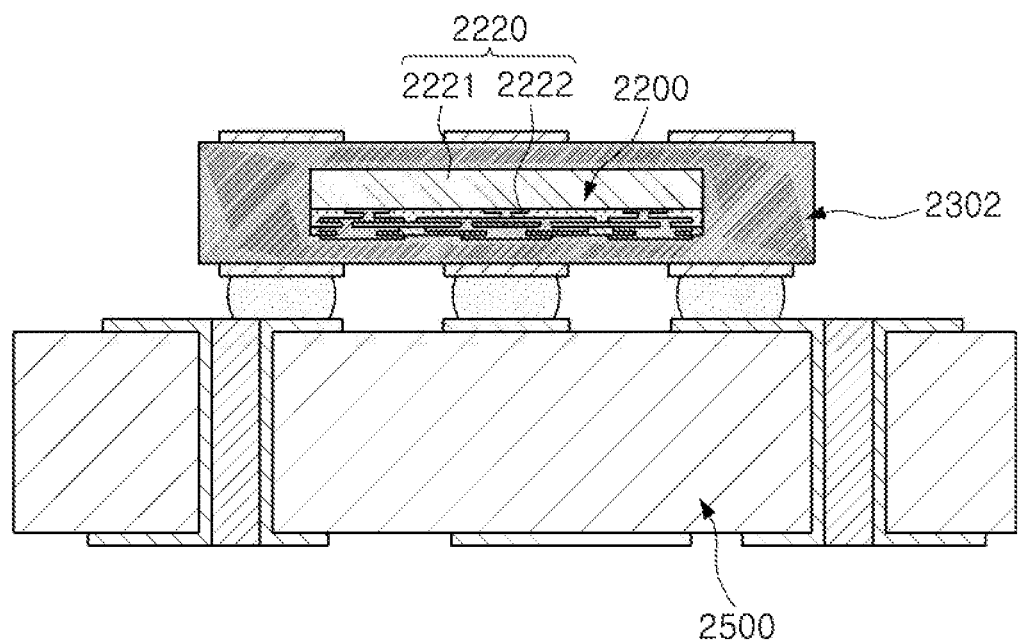
FIG. 23 is a schematic cross-sectional view illustrating an example in which a fan-in semiconductor package is embedded in an interposer substrate and is finally mounted on a main board of an electronic device.

FIG. 22 is a schematic cross-sectional view illustrating an example in which the fan-in semiconductor package 2200 is mounted on an interposer substrate 2301 and is ultimately mounted on a mainboard 2500 of an electronic device. FIG. 23 is a schematic cross-sectional view illustrating a case in which the fan-in semiconductor package 2200 is embedded in a separate interposer substrate 2302 and is ultimately mounted on the mainboard 2500 of an electronic device.

Referring to FIG. 22, connection pads 2222, that is, I/O terminals, of the semiconductor chip 2220 may be redistributed through the interposer substrate 2301, and the fan-in semiconductor package 2200 may be ultimately mounted on the mainboard 2500 of the electronic device in a state in which the fan-in semiconductor package 2200 is mounted on the interposer substrate 2301. In this example, solder balls 2270, and the like, may be fixed by an underfill resin 2280, or the like, and an outer side of the semiconductor chip 2220 may be covered with a molding material 2290, or the like.

Alternatively, in the example of FIG. 23, the fan-in semiconductor package 2200 may be embedded in the separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use a fan-in semiconductor package on a mainboard of an electronic device. Therefore, the fan-in semiconductor package may be mounted on the separate interposer substrate and then be mounted on the mainboard of the electronic device through a packaging process, or may be mounted and used on the mainboard of the electronic device in a state in which the fan-in semiconductor package is embedded in the interposer substrate.

Figure 24:
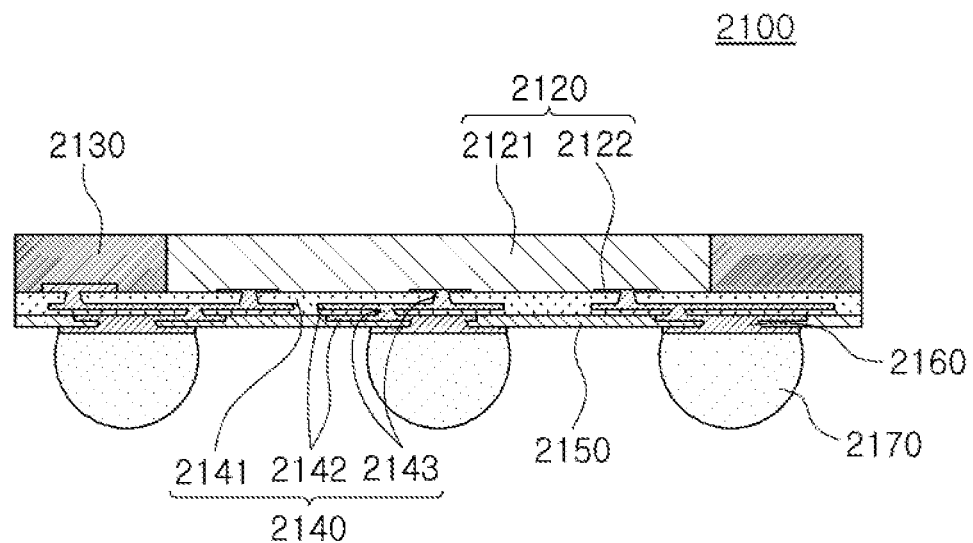
FIG. 24 is a schematic cross-sectional view illustrating a fan-out semiconductor package, according to an embodiment.

FIG. 24 is a schematic cross-sectional view illustrating a fan-out semiconductor package 2100.

Referring to FIG. 24, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this example, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and other components or layers. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package 2100 may have a form in which I/O terminals of the semiconductor chip 2120 are redistributed and disposed outwardly of the semiconductor chip 2120 through the connection member 2140 formed on the semiconductor chip 2120. As described above, in the fan-in semiconductor package 2100, all I/O terminals of the semiconductor chip 2120 need to be disposed inside the semiconductor chip 2120. Therefore, when a size of the semiconductor chip 2120 is decreased, a size and a pitch of the solder balls 2170 need to be decreased, such that a standardized solder ball layout may not be used in a fan-in semiconductor package. On the other hand, the fan-out semiconductor package 2100 has the form in which the I/O terminals of the semiconductor chip are 2120 redistributed and disposed outwardly of the semiconductor chip 2120 through the connection member 2140 formed on the semiconductor chip 2120 as described above. Therefore, even in a case that a size of the semiconductor chip 2120 is decreased, a standardized solder ball layout may be used in the fan-out semiconductor package as it is, such that the fan-out semiconductor package 2100 may be mounted on a mainboard of an electronic device without using a separate interposer substrate, as described below.

Figure 25:
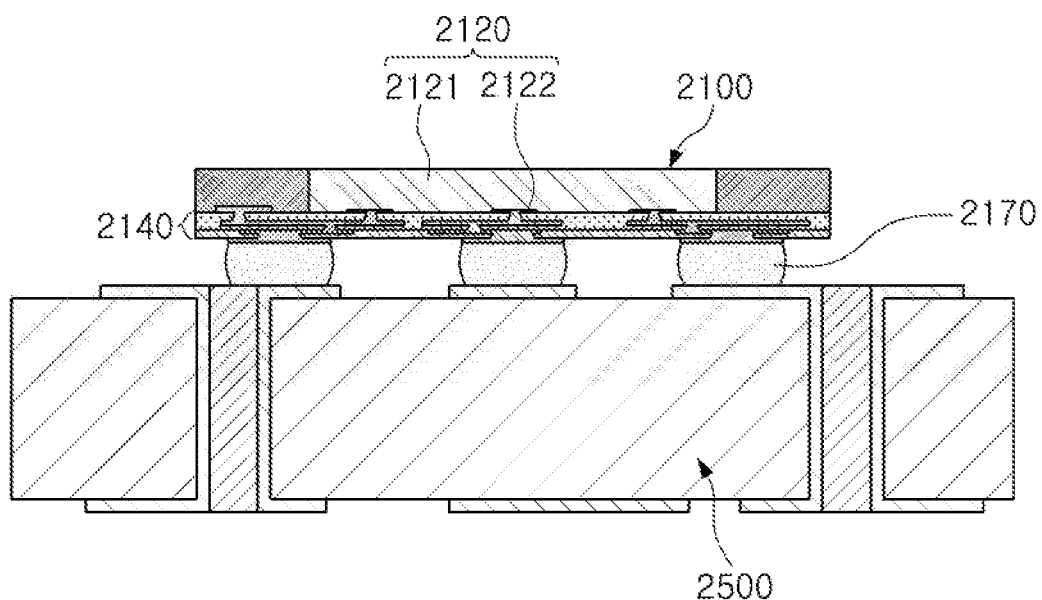
FIG. 25 is a schematic cross-sectional view illustrating an example in which a fan-out semiconductor package is mounted on a main board of an electronic device.

FIG. 25 is a schematic cross-sectional view illustrating an example in which the fan-out semiconductor package 2100 is mounted on the mainboard 2500 of the electronic device.

Referring to FIG. 25, the fan-out semiconductor package 2100 may be mounted on the mainboard 2500 of an electronic device through the solder balls 2170, or the like. That is, as described above, the fan-out semiconductor package 2100 includes the connection member 2140 formed on the semiconductor chip 2120 and configured to redistribute the connection pads 2122 to a fan-out region that is outside of a size of the semiconductor chip 2120, such that the standardized solder ball layout may be used in the fan-out semiconductor package 2100 as it is. As a result, the fan-out semiconductor package 2100 may be mounted on the mainboard 2500 of an electronic device without using a separate interposer substrate, or the like.

As described above, since the fan-out semiconductor package 2100 may be mounted on the mainboard of the electronic device without using the separate interposer substrate, the fan-out semiconductor package 2100 may be implemented at a thickness lower than that of the fan-in semiconductor package 2200 using the interposer substrate 2302. Therefore, the fan-out semiconductor package 2100 may be miniaturized and thinned. In addition, the fan-out semiconductor package 2100 has excellent thermal characteristics and electrical characteristics, such that it is particularly appropriate for a mobile product. Therefore, the fan-out semiconductor package may be implemented in a form that is more compact than that of a general package-on-package (POP) type using a printed circuit board (PCB), and may solve a problem due to occurrence of a warpage phenomenon.

As described herein, a fan-out semiconductor package is a package technology for mounting a semiconductor chip on a mainboard of an electronic device, or the like, as described above, and protecting the semiconductor chip from external impacts. The fan-out semiconductor package is a concept different from that of a printed circuit board (PCB) such as an interposer substrate, or the like, having a scale and a purpose that are different from those of the fan-out semiconductor package, and having the fan-in semiconductor package embedded therein.

As set forth above, according to the embodiments described herein, an antenna module may have a structure in which the antenna module may be easily miniaturized while having the high level of antenna performance by disposing a dielectric member on each of antenna members or diversifying a height of the dielectric member disposed on each of the antenna members.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module, comprising:
    a connection member comprising at least one wiring layer and at least one insulating layer;
    an integrated circuit (IC) disposed on a first surface of the connection member and electrically connected to the at least one wiring layer;
    an antenna package comprising antenna members configured to transmit or receive a radio frequency (RF) signal, feed vias each comprising one end electrically connected to a respective one of the antenna members and another end electrically connected to the at least one wiring layer, and a dielectric layer having a height greater than a height of the at least one insulating layer, the antenna package having a first surface facing a second surface of the connection member;
    an encapsulated member disposed on a second surface of the antenna package;
    dielectric members disposed on the encapsulation member in positions corresponding to the antenna members; and
    director members disposed in and covered by respective dielectric members among the dielectric members, and configured to transmit or receive the RF signal together with a corresponding antenna member among the antenna members.

2. The antenna module of claim 1, wherein each of the dielectric members has a form of hemisphere or a semi-convex lens.

3. The antenna module of claim 1, wherein a dielectric constant of each of the dielectric members is the same as a dielectric constant of the encapsulation member.

4. The antenna module of claim 1, wherein a dielectric constant of each of the dielectric members is different from a dielectric constant of the at least one insulating layer, and
    a dielectric constant of the dielectric layer is different from the dielectric constant of the at least one insulating layer.

5. The antenna module of claim 1, wherein the antenna package further comprises a plating member disposed around a side surface of each of the feed vias and covering at least a portion of the first surface of the antenna package.

6. The antenna module of claim 1, wherein the antenna package further comprises a directional antenna member electrically connected to the at least one wiring layer and configured to transmit or receive a second RF signal to a third surface of the antenna package, and
    wherein the antenna module further comprises a directional dielectric member disposed on the third surface of the antenna package.

7. The antenna module of claim 1, further comprising:
    a core member disposed on the first surface or the second surface of the connection member and forming an accommodation space; and
    a passive component disposed in the accommodation space and electrically connected to the at least one wiring layer.

8. The antenna module of claim 1, further comprising a core via disposed on the first surface of the connection member and electrically connected to the at least one wiring layer,
    wherein the IC is configured to receive a base signal from the core via and generate the RF signal in a millimeter wave (mmWave) band based on the base signal.

9. The antenna module of claim 1, further comprising a fan-out semiconductor package comprising an encapsulant encapsulating at least a portion of the IC, and a core member,
    wherein the core member comprises a core via electrically connected to the at least one wiring layer, a core insulating layer surrounding a side surface of the core via, and a core wiring layer disposed on a first surface or a second surface of the core insulating layer and electrically connected to the core via.

10. An antenna module, comprising:
a connection member comprising at least one wiring layer and at least one insulating layer;
an integrated circuit (IC) disposed on a first surface of the connection member and electrically connected to the at least one wiring layer;
an antenna package having a first surface facing a second surface of the connection member, the antenna package comprising antenna members configured to transmit or receive a radio frequency (RF) signal, feed vias each comprising one end electrically connected to a respective one of the antenna members and another end electrically connected to the at least one wiring layer, a dielectric layer having a height greater than a height of the at least one insulating layer, and a directional antenna member electrically connected to the at least one wiring layer and configured to transmit or receive a second RF signal to a third surface of the antenna package;
dielectric members disposed in positions corresponding to the antenna members on a second surface of the antenna package; and
a directional dielectric member disposed on the third surface of the antenna package.

* * * * *